(12) United States Patent
Ong

(10) Patent No.: US 9,116,210 B2
(45) Date of Patent: *Aug. 25, 2015

(54) INTEGRATED CIRCUIT TESTING MODULE INCLUDING SIGNAL SHAPING INTERFACE

(75) Inventor: Adrian E. Ong, Pleasanton, CA (US)

(73) Assignee: RAMBUS INC., Sunnyvale, CA (US)

( * ) Notice: Subject to any disclaimer, the term of this patent is extended or adjusted under 35 U.S.C. 154(b) by 446 days.

This patent is subject to a terminal disclaimer.

(21) Appl. No.: 13/609,019

(22) Filed: Sep. 10, 2012

(65) Prior Publication Data

US 2013/0066581 A1    Mar. 14, 2013

Related U.S. Application Data

(60) Continuation of application No. 13/162,112, filed on Jun. 16, 2011, now Pat. No. 8,286,046, which is a continuation of application No. 11/552,938, filed on Oct. 25, 2006, now Pat. No. 8,001,439, which is a continuation-in-part of application No. 11/369,878, filed on Mar. 6, 2006, now Pat. No. 7,370,256, which (Continued)

(51) Int. Cl.
| | |
|---|---|
| *G06F 11/00* | (2006.01) |
| *G01R 31/319* | (2006.01) |
| *G06F 11/27* | (2006.01) |
| *G06F 11/263* | (2006.01) |
| *G06F 11/273* | (2006.01) |
| *G11C 29/14* | (2006.01) |
| *G11C 29/56* | (2006.01) |

(52) U.S. Cl.
CPC ........ *G01R 31/31928* (2013.01); *G06F 11/263* (2013.01); *G06F 11/27* (2013.01); *G06F 11/2733* (2013.01); *G11C 29/14* (2013.01); *G11C 29/56* (2013.01); *G11C 29/56012* (2013.01); *G11C 2029/5602* (2013.01)

(58) Field of Classification Search
CPC ............... G11C 29/56012; G11C 7/22; G01R 31/31922; G06F 11/27; G06F 11/263; G06F 11/2635
USPC .......................... 714/738, 739, 744, 798, 724
See application file for complete search history.

(56) References Cited

U.S. PATENT DOCUMENTS

| | | | |
|---|---|---|---|
| 4,263,650 A | 4/1981 | Bennett et al. |
| 4,698,830 A | 10/1987 | Barzilai et al. |
| 4,743,841 A | 5/1988 | Takeuchi |
| 4,773,028 A | 9/1988 | Tallman |
| 4,825,414 A | 4/1989 | Kawata |
| 4,873,669 A | 10/1989 | Furutani et al. |

(Continued)

FOREIGN PATENT DOCUMENTS

| | | |
|---|---|---|
| EP | 0312217 | 4/1989 |
| JP | 02-095283 | 4/1990 |

(Continued)

OTHER PUBLICATIONS

"Silicon on Insulator", dated Jul. 10, 2011, http://en.wikipedia.org/wiki/Silicon on insulator. 4 pages.

*Primary Examiner* — Christine Tu
(74) *Attorney, Agent, or Firm* — Lowenstein Sandler LLP

(57) ABSTRACT

Systems and methods of testing integrated circuits are disclosed. The systems include a test module configured to operate between automated testing equipment and an integrated circuit to be tested. The testing interface is configured to test the integrated circuit at a higher slew rate than the slew rate at which signals are received from the automated testing equipment.

19 Claims, 27 Drawing Sheets

Related U.S. Application Data is a continuation-in-part of application No. 11/304,445, filed on Dec. 14, 2005, now Pat. No. 7,265,570, which is a continuation-in-part of application No. 10/824,734, filed on Apr. 15, 2004, now Pat. No. 7,139,945, and a continuation-in-part of application No. 10/870,365, filed on Jun. 17, 2004, now Pat. No. 7,103,815, which is a continuation of application No. 09/967,389, filed on Sep. 28, 2001, now Pat. No. 6,754,866, application No. 11/304,445, which is a continuation-in-part of application No. 11/083,473, filed on Mar. 18, 2005, now Pat. No. 7,313,740, which is a continuation-in-part of application No. 10/205,883, filed on Jul. 25, 2002, now abandoned, application No. 11/304,445, which is a continuation-in-part of application No. 11/207,518, filed on Aug. 19, 2005, now Pat. No. 7,444,575, and a continuation-in-part of application No. 11/223,286, filed on Sep. 9, 2005, now Pat. No. 7,245,141, each which is a continuation-in-part of application No. 11/108,385, filed on Apr. 18, 2005, now Pat. No. 7,259,582, which is a division of application No. 10/608,613, filed on Jun. 27, 2003, now Pat. No. 6,882,171, which is a continuation-in-part of application No. 10/305,635, filed on Nov. 27, 2002, now Pat. No. 6,812,726, application No. 11/223,286, which is a continuation-in-part of application No. 10/679,673, filed on Oct. 3, 2003, now Pat. No. 7,006,940, application No. 11/304,445, which is a continuation-in-part of application No. 11/258,484, filed on Oct. 24, 2005, now Pat. No. 7,404,117.

(56) References Cited

U.S. PATENT DOCUMENTS

| | | | |
|---|---|---|---|
| 4,931,723 | A | 6/1990 | Jeffrey et al. |
| 5,151,881 | A | 9/1992 | Kajigaya et al. |
| 5,177,594 | A | 1/1993 | Chance et al. |
| 5,251,095 | A | 10/1993 | Miller et al. |
| 5,258,648 | A | 11/1993 | Lin |
| 5,271,019 | A | 12/1993 | Edwards et al. |
| 5,301,156 | A | 4/1994 | Talley |
| 5,301,199 | A | 4/1994 | Ikenaga et al. |
| 5,326,428 | A | 7/1994 | Farnworth et al. |
| 5,327,013 | A | 7/1994 | Moore et al. |
| 5,355,283 | A | 10/1994 | Marrs et al. |
| 5,388,104 | A | 2/1995 | Shirotori et al. |
| 5,418,452 | A | 5/1995 | Pyle |
| 5,457,400 | A | 10/1995 | Ahmad et al. |
| 5,477,545 | A | 12/1995 | Huang |
| 5,479,105 | A | 12/1995 | Kim et al. |
| 5,499,250 | A | 3/1996 | Ingalls et al. |
| 5,506,499 | A | 4/1996 | Puar |
| 5,517,515 | A | 5/1996 | Spall et al. |
| 5,523,697 | A | 6/1996 | Farnworth et al. |
| 5,528,539 | A | 6/1996 | Ong et al. |
| 5,535,165 | A | 7/1996 | Davis et al. |
| 5,594,694 | A | 1/1997 | Roohparvar et al. |
| 5,604,432 | A | 2/1997 | Moore et al. |
| 5,619,461 | A | 4/1997 | Roohparvar |
| 5,657,284 | A | 8/1997 | Beffa |
| 5,666,049 | A | 9/1997 | Yamada et al. |
| 5,677,884 | A | 10/1997 | Zagar et al. |
| 5,677,885 | A | 10/1997 | Roohparvar |
| 5,703,400 | A | 12/1997 | Wojnarowski et al. |
| 5,717,245 | A | 2/1998 | Pedder |
| 5,719,438 | A | 2/1998 | Beilstein, Jr. et al. |
| 5,751,015 | A | 5/1998 | Corbett |
| 5,751,987 | A | 5/1998 | Mahant-Shetti et al. |
| 5,761,145 | A | 6/1998 | Zagar et al. |
| 5,770,477 | A | 6/1998 | Brandenburg |
| 5,794,175 | A | 8/1998 | Conner |
| 5,801,452 | A | 9/1998 | Farnworth et al. |
| 5,805,609 | A | 9/1998 | Mote, Jr. |
| 5,807,762 | A | 9/1998 | Akram et al. |
| 5,825,697 | A | 10/1998 | Gilliam et al. |
| 5,825,782 | A | 10/1998 | Roohparvar |
| 5,838,620 | A | 11/1998 | Zagar et al. |
| 5,840,417 | A | 11/1998 | Bolger |
| 5,854,534 | A | 12/1998 | Beilin et al. |
| 5,870,591 | A | 2/1999 | Sawada |
| 5,912,579 | A | 6/1999 | Zagar et al. |
| 5,923,600 | A | 7/1999 | Momohara |
| 5,925,142 | A | 7/1999 | Raad et al. |
| 5,933,379 | A | 8/1999 | Park et al. |
| 5,936,260 | A | 8/1999 | Corbett et al. |
| 5,959,310 | A | 9/1999 | Akram et al. |
| 5,966,388 | A | 10/1999 | Wright et al. |
| 5,970,008 | A | 10/1999 | Zagar et al. |
| 5,995,379 | A | 11/1999 | Kyougoku et al. |
| 6,011,720 | A | 1/2000 | Tanaka |
| 6,022,758 | A | 2/2000 | Badehi |
| 6,026,039 | A | 2/2000 | Kim et al. |
| 6,047,393 | A | 4/2000 | Yamada |
| 6,052,287 | A | 4/2000 | Palmer et al. |
| 6,069,483 | A | 5/2000 | Maxwell et al. |
| 6,070,256 | A | 5/2000 | Wu et al. |
| 6,072,326 | A | 6/2000 | Akram et al. |
| 6,087,676 | A | 7/2000 | Akram et al. |
| 6,097,647 | A | 8/2000 | Zagar et al. |
| 6,100,708 | A | 8/2000 | Mizuta |
| 6,100,716 | A | 8/2000 | Adham et al. |
| 6,104,645 | A | 8/2000 | Ong et al. |
| 6,104,658 | A | 8/2000 | Lu |
| 6,104,664 | A | 8/2000 | Ohno |
| 6,137,167 | A | 10/2000 | Ahn et al. |
| 6,154,860 | A | 11/2000 | Wright et al. |
| 6,157,046 | A | 12/2000 | Corbett et al. |
| 6,188,232 | B1 | 2/2001 | Akram et al. |
| 6,191,603 | B1 | 2/2001 | Muradali et al. |
| 6,194,738 | B1 | 2/2001 | Debenham et al. |
| 6,205,082 | B1 | 3/2001 | Tomita et al. |
| 6,208,157 | B1 | 3/2001 | Akram et al. |
| 6,208,568 | B1 | 3/2001 | Zagar et al. |
| 6,216,240 | B1 | 4/2001 | Won et al. |
| 6,216,241 | B1 | 4/2001 | Fenstermaker et al. |
| 6,221,753 | B1 | 4/2001 | Seyyedy |
| 6,243,839 | B1 | 6/2001 | Roohparvar |
| 6,243,840 | B1 | 6/2001 | Raad et al. |
| 6,253,344 | B1 | 6/2001 | Fin et al. |
| 6,263,463 | B1 | 7/2001 | Hashimoto |
| 6,274,937 | B1 | 8/2001 | Ahn et al. |
| 6,286,115 | B1 | 9/2001 | Stubbs |
| 6,294,839 | B1 | 9/2001 | Mess et al. |
| 6,298,001 | B1 | 10/2001 | Lee et al. |
| 6,298,429 | B1 | 10/2001 | Scott et al. |
| 6,300,782 | B1 | 10/2001 | Hembree et al. |
| 6,310,484 | B1 | 10/2001 | Akram et al. |
| 6,320,201 | B1 | 11/2001 | Corbett et al. |
| 6,345,373 | B1 * | 2/2002 | Chakradhar et al. ......... 714/738 |
| 6,351,681 | B1 | 2/2002 | Chih et al. |
| RE37,611 | E | 3/2002 | Roohparvar |
| 6,365,421 | B2 | 4/2002 | Debenham et al. |
| 6,366,487 | B1 | 4/2002 | Yeom |
| 6,392,948 | B1 | 5/2002 | Lee |
| 6,395,565 | B1 | 5/2002 | Akram et al. |
| 6,396,291 | B1 | 5/2002 | Akram et al. |
| 6,407,566 | B1 | 6/2002 | Brunelle et al. |
| 6,441,479 | B1 | 8/2002 | Ahn et al. |
| 6,445,625 | B1 | 9/2002 | Abedifard |
| 6,456,099 | B1 | 9/2002 | Eldridge et al. |
| 6,457,141 | B1 | 9/2002 | Kim et al. |
| 6,470,484 | B1 | 10/2002 | Day et al. |
| 6,472,747 | B2 | 10/2002 | Bazarjani et al. |
| 6,483,760 | B2 | 11/2002 | Kang |
| 6,484,279 | B2 | 11/2002 | Akram |
| 6,492,727 | B2 | 12/2002 | Nishizawa et al. |
| 6,502,215 | B2 | 12/2002 | Raad et al. |
| 6,507,885 | B2 | 1/2003 | Lakhani et al. |
| 6,519,171 | B2 | 2/2003 | Matsuzaki et al. |
| 6,519,725 | B1 | 2/2003 | Huisman |

(56) References Cited

U.S. PATENT DOCUMENTS

| | | |
|---|---|---|
| 6,531,339 B2 | 3/2003 | King et al. |
| 6,532,561 B1 | 3/2003 | Turnquist et al. |
| 6,553,529 B1 | 4/2003 | Reichert |
| 6,556,492 B2 | 4/2003 | Ernst et al. |
| 6,643,434 B2 | 11/2003 | Cayrefourcq et al. |
| 6,675,269 B2 | 1/2004 | Miura et al. |
| 6,693,449 B1 | 2/2004 | Gorgen |
| 6,708,264 B1 | 3/2004 | Abe et al. |
| 6,711,042 B2 | 3/2004 | Ishikawa |
| 6,732,304 B1 | 5/2004 | Ong |
| 6,732,305 B2 | 5/2004 | Jones et al. |
| 6,754,866 B1 | 6/2004 | Ong |
| 6,760,857 B1 | 7/2004 | Lau |
| 6,771,061 B2 | 8/2004 | Sartschev et al. |
| 6,791,175 B2 | 9/2004 | Matsuo et al. |
| 6,801,461 B2 | 10/2004 | Hii et al. |
| 6,812,726 B1 | 11/2004 | Ong |
| 6,825,683 B1 | 11/2004 | Berndt et al. |
| 6,882,171 B2 | 4/2005 | Ong |
| 6,894,945 B2 | 5/2005 | Sawada |
| 6,904,375 B1 | 6/2005 | Sabih et al. |
| 6,907,555 B1 | 6/2005 | Nomura et al. |
| 6,959,257 B1 | 10/2005 | Larky et al. |
| 6,967,397 B2 | 11/2005 | Inoue et al. |
| 6,971,054 B2 | 11/2005 | Kurtulik et al. |
| 6,988,232 B2 | 1/2006 | Ricchetti et al. |
| 6,996,652 B1 | 2/2006 | Ong |
| 6,996,745 B1 | 2/2006 | Shaylor |
| 6,996,754 B1 | 2/2006 | Lee |
| 7,006,940 B1 | 2/2006 | Ong |
| 7,007,212 B2 | 2/2006 | Komatsu et al. |
| 7,053,470 B1 | 5/2006 | Sellers et al. |
| 7,061,263 B1 | 6/2006 | Ong |
| 7,075,175 B2 | 7/2006 | Kazi et al. |
| 7,103,815 B2 | 9/2006 | Ong |
| 7,114,113 B2 | 9/2006 | Yonaga et al. |
| 7,133,798 B1 | 11/2006 | Ong |
| 7,139,204 B1 | 11/2006 | Behera |
| 7,139,945 B2 | 11/2006 | Ong |
| 7,149,135 B2 | 12/2006 | Okuno |
| 7,240,254 B2 | 7/2007 | Ong |
| 7,245,141 B2 | 7/2007 | Ong |
| 7,259,582 B2 | 8/2007 | Ong |
| 7,265,570 B2 | 9/2007 | Ong |
| 7,269,524 B1 | 9/2007 | Ong et al. |
| 7,269,765 B1 | 9/2007 | Charlton et al. |
| 7,305,595 B2 | 12/2007 | Goodwin et al. |
| 7,307,442 B2 | 12/2007 | Ong |
| 7,309,999 B2 | 12/2007 | Ong |
| 7,310,000 B2 | 12/2007 | Ong |
| 7,313,740 B2 | 12/2007 | Ong |
| 7,365,557 B1 | 4/2008 | Ong |
| 7,365,667 B1 | 4/2008 | Nanda et al. |
| 7,370,256 B2 | 5/2008 | Ong |
| 7,404,117 B2 | 7/2008 | Ong et al. |
| 7,444,575 B2 | 10/2008 | Ong |
| 7,446,551 B1 | 11/2008 | Ong |
| 7,466,160 B2 | 12/2008 | Ong et al. |
| 7,516,384 B2 * | 4/2009 | Jeong et al. .................. 714/744 |
| 7,593,271 B2 | 9/2009 | Ong |
| 7,673,193 B1 | 3/2010 | Ong et al. |
| 7,745,920 B2 | 6/2010 | Lee et al. |
| 7,779,311 B2 | 8/2010 | Ong |
| 7,810,003 B2 * | 10/2010 | Seong ......................... 714/731 |
| 8,001,439 B2 | 8/2011 | Ong |
| 2002/0017720 A1 | 2/2002 | Nishizawa et al. |
| 2002/0049946 A1 | 4/2002 | Tomishima et al. |
| 2002/0105522 A1 | 8/2002 | Kolluru et al. |
| 2002/0117729 A1 | 8/2002 | Aiki et al. |
| 2002/0170003 A1 | 11/2002 | Hirabayashi |
| 2003/0005361 A1 | 1/2003 | Ernst et al. |
| 2003/0235929 A1 | 12/2003 | Cowles et al. |
| 2004/0008560 A1 | 1/2004 | Aoki |
| 2004/0019841 A1 | 1/2004 | Ong |
| 2004/0027150 A1 | 2/2004 | Miura et al. |
| 2004/0044491 A1 | 3/2004 | Yonaga et al. |
| 2004/0100296 A1 | 5/2004 | Ong |
| 2004/0117696 A1 | 6/2004 | Ito |
| 2004/0145935 A1 | 7/2004 | Jakobs |
| 2004/0150089 A1 | 8/2004 | Inoue et al. |
| 2004/0153924 A1 | 8/2004 | Shinagawa et al. |
| 2004/0196709 A1 | 10/2004 | Ong |
| 2004/0221188 A1 | 11/2004 | Lau et al. |
| 2004/0232559 A1 | 11/2004 | Adelmann |
| 2005/0023656 A1 | 2/2005 | Leedy |
| 2005/0024977 A1 | 2/2005 | Ong |
| 2005/0120270 A1 | 6/2005 | Anand et al. |
| 2005/0152190 A1 | 7/2005 | Fukuda |
| 2005/0162182 A1 | 7/2005 | Ong |
| 2005/0204223 A1 | 9/2005 | Ong |
| 2005/0204230 A1 | 9/2005 | Nilson |
| 2005/0289428 A1 | 12/2005 | Ong |
| 2006/0107186 A1 | 5/2006 | Cowell et al. |
| 2006/0152241 A1 | 7/2006 | Ong |
| 2006/0236180 A1 | 10/2006 | Ong |
| 2006/0253266 A1 | 11/2006 | Ong |
| 2006/0279308 A1 | 12/2006 | Ong |
| 2007/0067687 A1 | 3/2007 | Ong |
| 2007/0079204 A1 | 4/2007 | Ong |
| 2007/0094555 A1 | 4/2007 | Ong et al. |
| 2007/0113126 A1 | 5/2007 | Ong |
| 2007/0263458 A1 | 11/2007 | Ong |

FOREIGN PATENT DOCUMENTS

| | | |
|---|---|---|
| JP | 07-078495 | 3/1995 |
| JP | 07-218602 | 8/1995 |
| JP | 07-270492 | 10/1995 |
| JP | 11-306797 | 11/1999 |
| JP | 2000-207900 | 7/2000 |
| JP | 2002-279796 | 9/2002 |
| JP | 2003-007086 | 1/2003 |
| JP | 2004-046927 | 2/2004 |
| JP | 2004-093421 | 3/2004 |
| JP | 2004-185691 | 7/2004 |
| JP | 2005-174486 | 6/2005 |

* cited by examiner

| Item | Test Mode Description | Code Name | Persist | TDQ (Test Code) 7 | 6 | 5 | 4 | 3 | 2 | 1 | 0 |
|---|---|---|---|---|---|---|---|---|---|---|---|
| 1 | No Test | | N | 0 | 0 | x | x | x | 0 | 0 | 0 |
| 2 | Load row address (A0 - A7) | LRA07 | N | 0 | 0 | x | x | x | 0 | 0 | 1 |
| 3 | Load row address (A8 - A15) | LRA815 | N | 0 | 0 | x | x | x | 0 | 1 | 0 |
| 4 | Reserve for row address | | N | 0 | 0 | x | x | x | 0 | 1 | 1 |
| 5 | Set row counter LSB (A0 - A7) | SRLSB07 | N | 0 | 0 | x | x | x | 1 | 0 | 0 |
| 6 | Set row counter LSB (A8 - A15) | SRLSB815 | N | 0 | 0 | x | x | x | 1 | 0 | 1 |
| 7 | Reserve for row LSB | | N | 0 | 0 | x | x | x | 1 | 1 | 0 |
| 8 | Set row counter to count down | RCNTD | Y | 0 | 0 | x | x | x | 1 | 1 | 1 |
| 9 | No Test | | N | 0 | 0 | 0 | 0 | 0 | x | x | x |
| 10 | Load column address (A0 - A7) | LCA07 | N | 0 | 0 | 0 | 0 | 1 | x | x | x |
| 11 | Load column address (A8 - A15) | LCA815 | N | 0 | 0 | 0 | 1 | 0 | x | x | x |
| 12 | Reserve for column address | | N | 0 | 0 | 0 | 1 | 1 | x | x | x |
| 13 | Set column counter LSB (A0 - A7) | SCLSB07 | N | 0 | 0 | 1 | 0 | 0 | x | x | x |
| 14 | Set column counter LSB (A8 - A15) | SCLSB815 | N | 0 | 0 | 1 | 0 | 1 | x | x | x |
| 15 | Reserve for column LSB | | N | 0 | 0 | 1 | 1 | 0 | x | x | x |
| 16 | Set column counter to count down | CCNTD | Y | 0 | 0 | 1 | 1 | 1 | x | x | x |

FIG. 3A

| Item | Test Mode Description | Code Name | Persist | TDQ (Test Code) | | | | | | | |
|------|----------------------|-----------|---------|---|---|---|---|---|---|---|---|
|      |                      |           |         | 7 | 6 | 5 | 4 | 3 | 2 | 1 | 0 |
| 17 | No Test | | N | 0 | 1 | x | x | x | 0 | 0 | 0 |
| 18 | Load MRS address (A0 - A7) | LMR07 | N | 0 | 1 | x | x | x | 0 | 0 | 1 |
| 19 | Load MRS address (A8 - A15) | LMR815 | N | 0 | 1 | x | x | x | 0 | 1 | 0 |
| 20 | Reserve for MRS address | | N | 0 | 1 | x | x | x | 0 | 1 | 1 |
| 21 | Reserve | | N | 0 | 1 | x | x | x | 1 | 0 | 0 |
| 22 | Reserve | | N | 0 | 1 | x | x | x | 1 | 0 | 1 |
| 23 | Enable chip ID read out | 1 | N | 0 | 1 | x | x | x | 1 | 1 | 0 |
| 24 | Reserve | CHID | Y | 0 | 1 | x | x | x | 1 | 1 | 1 |
| 25 | No Test | | N | 0 | 1 | 0 | 0 | 0 | x | x | x |
| 26 | Load data background scramble | TOPO | N | 0 | 1 | 0 | 0 | 1 | x | x | x |
| 27 | Uncompress Data-out | T4B | N | 0 | 1 | 0 | 1 | 0 | x | x | x |
| 28 | Reserve | | N | 0 | 1 | 0 | 1 | 1 | x | x | x |
| 29 | Reserve | | N | 0 | 1 | 1 | 0 | 0 | x | x | x |
| 30 | Invert Odd data bit | TINVO | N | 0 | 1 | 1 | 0 | 1 | x | x | x |
| 31 | Enable DDR operation | TDDR | N | 0 | 1 | 1 | 1 | 0 | x | x | x |
| 32 | Reserve | | Y | 0 | 1 | 1 | 1 | 1 | x | x | x |

FIG. 3B

| TDQ (Input) | Burst Address LSB (CA0) | Even Data Bit First | Default Mode | | | | DQ (Output) | | | |
|---|---|---|---|---|---|---|---|---|---|---|
| | | | DWe0 | DWo0 | DWe1 | DWo1 | Q0 | Q1 | Q2 | Q3 |
| 0 | 0 | Yes | 0 | 0 | 0 | 0 | 0 | 0 | 0 | 0 |
| 1 | 0 | Yes | 1 | 1 | 1 | 1 | 1 | 1 | 1 | 1 |
| 0 | 1 | No | 0 | 0 | 0 | 0 | 0 | 0 | 0 | 0 |
| 1 | 1 | No | 1 | 1 | 1 | 1 | 1 | 1 | 1 | 1 |

FIG. 7A

| TDQ (Input) | Burst Address LSB (CA0) | Even Data Bit First | Invert Odd Bit (TINVO = HIGH) | | | | DQ (Output) | | | |
|---|---|---|---|---|---|---|---|---|---|---|
| | | | DWe0 | DWo0 | DWe1 | DWo1 | Q0 | Q1 | Q2 | Q3 |
| 0 | 0 | Yes | 0 | 1 | 0 | 1 | 0 | 1 | 0 | 1 |
| 1 | 0 | Yes | 1 | 0 | 1 | 0 | 1 | 0 | 1 | 0 |
| 0 | 1 | No | 0 | 1 | 0 | 1 | 1 | 0 | 1 | 0 |
| 1 | 1 | No | 1 | 0 | 1 | 0 | 0 | 1 | 0 | 1 |

| Parameter 1010 | Symbol | Default | T-2 | T-1 | T+1 | T+2 | Units |
|---|---|---|---|---|---|---|---|
| Test Interface Internal Clock Period | tCK | 3.75 | - | - | - | - | ns |
| Load Mode command cycle | tMRD | 2 | - | - | - | - | tCK |
| Active to Read/Write | tRCD | 3 | - | 2 | 4 | 5 | tCK |
| Row Active period | tRAS | 11 | 9 | 10 | 12 | 13 | tCK |
| Precharge period | tRP | 3 | - | 2 | 4 | 5 | tCK |
| Precharge All period | tRPA | tRP + tCK | - | - | - | - | tCK |
| Active to Active (same bank) | tRC | 15 | 13 | 14 | 16 | 17 | tCK |
| Active to Active (diff. bank) | tRRD | 2 | - | 1 | - | - | tCK |
| Refresh to Active, or Refresh to Refresh | tRFC | 28 | 26 | 27 | 29 | 29 | tCK |
| 4 bank Active period (x4, x8) | tFAW | 10 | - | - | 11 | 12 | tCK |
| 4 bank Active period (x16, x32) | tFAW | 14 | - | - | 15 | 16 | tCK |
| Read to Precharge | tRTP | 2 | - | 1 | 3 | 3 | tCK |
| CAS\ to CAS\ command delay | tCCD | 2 | - | - | - | - | tCK |
| Write Recovery | tRW | 4 | - | 3 | 5 | 6 | tCK |
| Write to Read command delay | tWTR | 2 | - | 1 | 3 | 4 | tCK |
| Auto-precharge Write recovery + reecharge time | tDAL | tWR + tRP | - | - | - | - | tCK |

FIG. 10

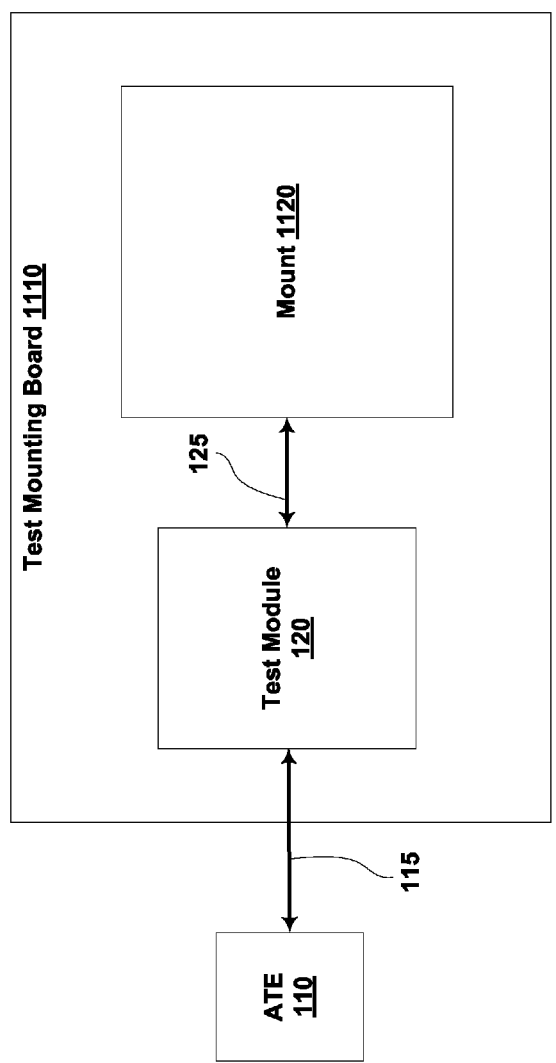

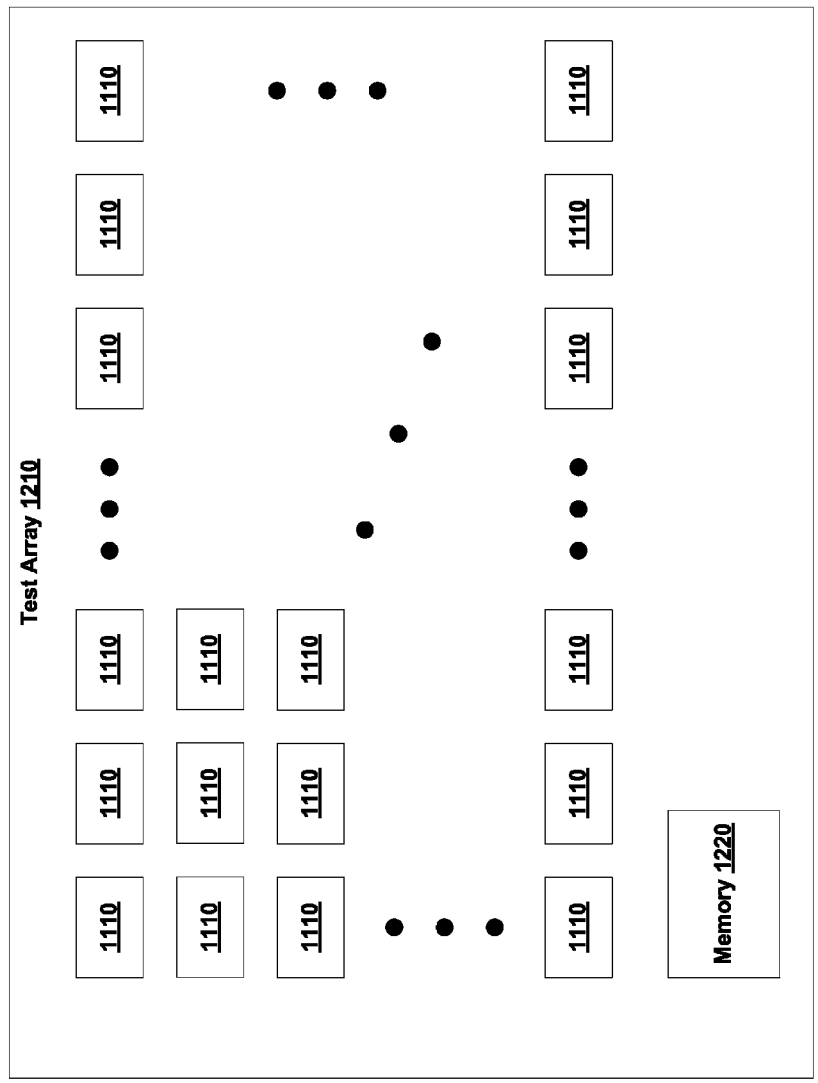

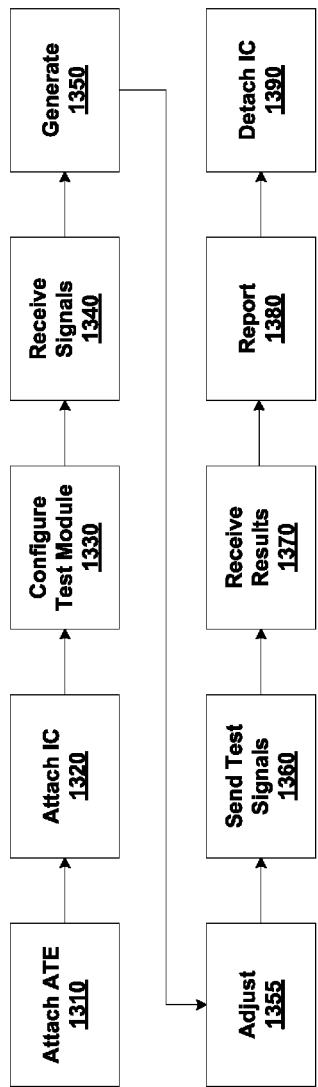
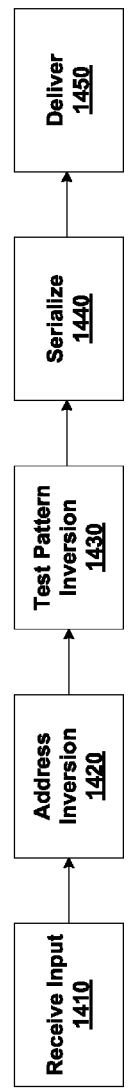
FIG. 13
FIG. 14

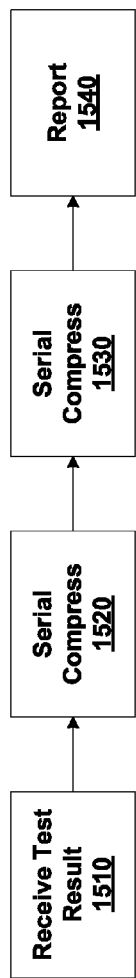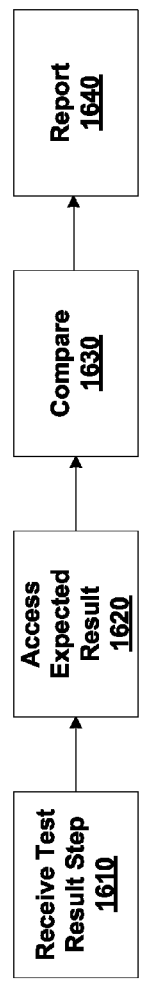

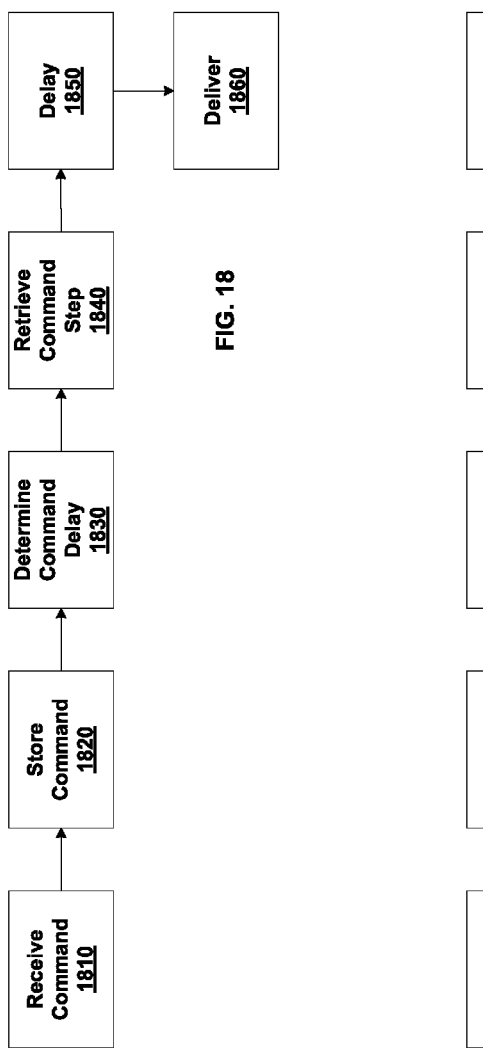

FIG. 22A

| TDQ(0-3) (Input) | | | | Even Data Bit First | Burst Address LSB (CA0) | Default Mode | | | | Enable Match | TDQ | |
|---|---|---|---|---|---|---|---|---|---|---|---|---|
| Q0 | Q1 | Q2 | Q3 | | | DRe0 | DRo0 | DRe1 | DRo1 | | PASS | FAIL |
| 0 | 0 | 0 | 0 | Yes | 0 | 0 | 0 | 0 | 0 | EM00 | 0 | 1 |
| 1 | 1 | 1 | 1 | Yes | 0 | 1 | 1 | 1 | 1 | EM11 | 1 | 0 |
| 0 | 0 | 0 | 0 | No | 1 | 0 | 0 | 0 | 0 | EM00 | 0 | 1 |
| 1 | 1 | 1 | 1 | No | 1 | 1 | 1 | 1 | 1 | EM11 | 1 | 0 |

FIG. 22B

| TDQ(0-3) (Input) | | | | Even Data Bit First | Burst Address LSB (CA0) | Invert Odd Bit | | | | Enable Match | TDQ | |
|---|---|---|---|---|---|---|---|---|---|---|---|---|
| Q0 | Q1 | Q2 | Q3 | | | DRe0 | DRo0 | DRe1 | DRo1 | | PASS | FAIL |
| 0 | 0 | 0 | 0 | Yes | 0 | 0 | 1 | 0 | 1 | EM01 | 0 | 1 |
| 1 | 1 | 1 | 1 | Yes | 0 | 1 | 0 | 1 | 0 | EM10 | 1 | 0 |
| 0 | 0 | 0 | 0 | No | 1 | 1 | 0 | 1 | 0 | EM01 | 0 | 1 |
| 1 | 1 | 1 | 1 | No | 1 | 0 | 1 | 0 | 1 | EM10 | 1 | 0 |

INTEGRATED CIRCUIT TESTING MODULE INCLUDING SIGNAL SHAPING INTERFACE

CROSS-REFERENCE TO RELATED APPLICATIONS

The present application is a continuation of U.S. application Ser. No. 13/162,112, filed Jun. 16, 2011, which is a continuation of U.S. application Ser. No. 11/552,938, entitled "Integrated Circuit Testing Module Including Signal Shaping Interface," and filed Oct. 25, 2006, now U.S. Pat. No. 8,001,439, which is in turn a continuation-in-part of U.S. application Ser. No. 11/369,878 entitled "Integrated Circuit Testing Module Including Data Compression," and filed Mar. 6, 2006, now U.S. Pat. No. 7,370,256 which is in turn: a continuation-in-part of U.S. application Ser. No. 11/304,445 entitled "Integrated Circuit Testing Module" filed on Dec. 14, 2005, now U.S. Pat. No. 7,265,570; a continuation-in-part of U.S. application Ser. No. 10/824,734 entitled "Chip Testing Within a Multi-Chip Semiconductor Package," filed on Apr. 15, 2004, now U.S. Pat. No. 7,139,945; a continuation-in-part of U.S. application Ser. No. 10/870,365 entitled "Testing of Integrated Circuit Devices," filed on Jun. 17, 2004, now U.S. Pat. No. 7,103,815 which is a continuation of application Ser. No. 09/967,389, filed on Sep. 28, 2001, now U.S. Pat. No. 6,754,866; a continuation-in-part of U.S. application Ser. No. 11/083,473 entitled "Internally Generating Patterns For Testing In An Integrated Circuit Device," filed on Mar. 18, 2005, now U.S. Pat. No. 7,313,740, which is a continuation in part of U.S. patent application Ser. No. 10/205,883 entitled "Internally Generating Patterns For Testing In An Integrated Circuit Device," filed on Jul. 25, 2002, which is abandoned; a continuation-in-part of U.S. application Ser. No. 11/108,385 entitled "Bonding Pads for Testing of a Semiconductor Device," filed on Apr. 18, 2005, now U.S. Pat. No. 7,259,582, which is a division of application Ser. No. 10/608,613, filed on Jun. 27, 2003, now U.S. Pat. No. 6,882,171, which is a continuation-in-part of application Ser. No. 10/305,635, filed on Nov. 27, 2002, now U.S. Pat. No. 6,812,726; a continuation-in-part of U.S. application Ser. No. 11/207,518 entitled "Architecture and Method for Testing of an Integrated Circuit Device," and filed on Aug. 19, 2005, now U.S. Pat. No. 7,444,575; a continuation-in-part of U.S. application Ser. No. 11/223,286 entitled "Shared Bond Pad for Testing a Memory within a Packaged Semiconductor Device," and filed Sep. 9, 2005, now U.S. Pat. No. 7,245,141 which is a continuation-in-part of U.S. patent application Ser. No. 11/108,385, filed on Apr. 18, 2005, now U.S. Pat. No. 7,259,582 which is a divisional of U.S. Pat. No. 6,882,171 filed on Jun. 27, 2003, which is a continuation-in-part of U.S. Pat. No. 6,812,726, filed on Nov. 27, 2002, U.S. application Ser. No. 11/223,286 is also a continuation-in-part of U.S. patent application Ser. No. 10/679,673, filed on Oct. 3, 2003, now U.S. Pat. No. 7,006,940; and a continuation-in-part of U.S. application Ser. No. 11/258,484 entitled "Component Testing and Recovery," and filed Oct. 24, 2005, now U.S. Pat. No. 7,404,117. The present application hereby claims priority under 35 U.S.C. §120 to the above-listed U.S. patent applications. Moreover, the entireties of the above-listed U.S. patents and patent applications are hereby incorporated by reference herein.

BACKGROUND

1. Field of the Invention

The current invention relates to integrated circuit devices, and in particular, to the testing of integrated circuit devices.

2. Related Art

An integrated circuit (IC) device may comprise many miniaturized circuits implemented in a semiconductor substrate. IC devices must be tested in order to ensure proper operation before they are used. IC devices can be tested in a limited fashion using built-in self test (BIST) circuitry that is implemented within the IC devices themselves. BIST testing, however, is incomplete and does not test all aspects of the device's operation. Thorough testing of an IC device is accomplished with complex and expensive external testing equipment.

As the complexity and clock speeds of ICs increase, the capabilities of existing external testing equipment can become a limiting factor in the testing of new ICs. For example, the clock speeds of the fastest memory devices increase on almost an annual basis. These memory devices cannot be tested at their maximum clock speeds using older testing equipment that was built for testing slower memory. In addition, the length of the cables between existing external testing equipment and the ICs under test (on the order of one to five meters) results in input signals to the IC device having slew rates too slow to reliably test parameters such as minimum set-up and hold times. Because of their cost, it is impractical to purchase new testing equipment with each advance in clock speeds. There is, therefore, a need for improved systems and methods of testing integrated circuits.

SUMMARY

The present invention includes, in various embodiments, a test module configured to operate between testing equipment and one or more integrated circuits to be tested. The test module is configured to communicate with the testing equipment at a first slew rate and to communicate with the integrated circuits to be tested at a second, typically faster, slew rate. In some embodiments, the test module includes components configured to generate addresses, commands, and test data for testing of memory devices responsive to data and commands received from the testing equipment. These memory devices can include, for example, DRAM (Dynamic Random Access Memory), SRAM (Static Random Access Memory), Flash Memory, or the like.

The integrated circuits to be tested are optionally embedded within an electronic device. For example, in some embodiments, the integrated circuits to be tested are memory circuits within a system-on-chip (SoC), system-in-package (SiP), system-in-module (SiM), module-in-module (MiM), package-over-package (POP), package-in-package (PiP), or the like. In these embodiments, the test module can be configured to operate the electronic device in a first mode wherein shared inputs to the electronic device are used to test first circuits within the electronic device, and a second mode wherein the shared inputs are used to communicate with other circuits within the electronic device. Thus, in some embodiments, the test module is configured to test circuits at a clock frequency faster than testing equipment being used, while also communicating to the circuits being tested in a test mode through shared inputs.

In some embodiments, the test module is configured to include a test plan memory component configured to store one or more test plans. A test plan may include a sequence of test patterns and/or conditional branches whereby the tests to be performed next are dependent on the results of the preceding tests. The test plan memory may, optionally, be detachable from the test module.

In various embodiments, the test system, as a whole, is capable of multiple layers of programming. For example, at one level, standard or more generic tests used for testing multiple classes of integrated circuit devices may be programmed and stored in non-detachable components of the test module. Other, device-specific tests may be programmed prior to each test session and downloaded into test plan memory. In addition, tests frequently updated may be more suited to being programmed and downloaded into one or more components of the test module prior to each test session or communicated to the test module during a test session. Through various combinations of how and where to store and/or input different portions of test plans, the invention is flexible and capable of multiple layers of programming.

In some embodiments, the test module includes a clock adjustment component configured to test time and slew sensitive parameters such as set-up time and hold time. The clock adjustment component is configured to receive an input clock signal from, for example, the automated testing equipment, and make an adjustment to one or more of its output signals. In some embodiments, an adjustment is made to the clock signal sent from the test module, resulting in a uniform adjustment to test signals sent to the integrated circuit. This uniform adjustment enables testing of parameters such as set-up time and hold-time of the integrated circuit as a whole.

In other embodiments, the adjustment is made to individual data channels of the test signals sent from the test module to the integrated circuit. By adjusting, for example, one or more bits of a test data pattern or one or more address lines sent to the integrated circuit, the test module is capable of testing the sensitivity of the integrated circuit to a variety of time critical and slew rate sensitive parameters, such as set-up and hold time.

Various embodiments of the invention include a system comprising one or more input components configured to receive signals having a first slew rate from an automated testing equipment configured to test an integrated circuit, one or more data generating components configured to generate test signals responsive to the signals received from the automated testing equipment, and one or more output components configured to convey the generated test signals to the integrated circuit at a second slew rate, the integrated circuit being detachable from the one or more output components, the second slew rate being faster than the first slew rate.

Various embodiments of the invention include a method comprising attaching an automated testing equipment to a test module having a clock synchronization component, attaching an integrated circuit to be tested to the test module, receiving signals having a first slew rate from the automated testing equipment at the test module, generating test signals within the test module responsive to the signals received from the automated testing equipment, and sending the generated test signals to the integrated circuit at a second slew rate faster than the first slew rate.

Various embodiments of the invention include a system comprising means for connecting a test module having a clock synchronization component between an automated testing equipment and an integrated circuit to be tested, means for receiving signals having a first slew rate from the automated testing equipment at the test module, means for generating test signals within the test module responsive to the signals received from the automated testing equipment, and means for sending the generated test signals to the integrated circuit at a second slew rate faster than the first slew rate.

Various embodiments of the invention include a system comprising a clock synchronization component, one or more input components configured to receive signals from an automated testing equipment configured to test an integrated circuit, one or more data generating components configured to generate test signals responsive to the signals received from the automated testing equipment, a clock adjustment component configured to adjust synchronization between the clock synchronization component and one or more elements of the generated test signals to be conveyed from the one or more output components to the integrated circuit in response to the signals received from the automated testing equipment, and one or more output components configured to convey the generated test signals to the integrated circuit, the integrated circuit being separable from the one or more output components.

Various embodiments of the invention include a method comprising attaching an automated testing equipment to a test module having a clock adjustment component, attaching an integrated circuit to be tested to the test module, receiving signals from the automated testing equipment at the test module, testing the integrated circuit according to the steps of: generating an adjustment to the clock synchronization responsive to the signals received from the automated testing equipment, generating test signals within the test module responsive to the signals received from the automated testing equipment, conveying the generated test signals to the integrated circuit using the adjustment to the clock synchronization, receiving data from the integrated circuit responsive to the conveyed generated test signals, and comparing the received data to an expected result Various embodiments of the invention include a system comprising means for connecting a test module between an automated testing equipment and an integrated circuit to be tested, means for configuring the test module for testing of the integrated circuit, means for receiving signals from the automated testing equipment at the test module, means for testing the integrated circuit according to the steps of: means for generating an adjustment to the clock synchronization responsive to the signals received from the automated testing equipment, means for generating test signals within the test module responsive to the signals received from the automated testing equipment, means for conveying the generated test signals to the integrated circuit using the adjustment to the clock synchronization, means for receiving data from the integrated circuit responsive to the conveyed generated test signals, and means for comparing the received data to an expected result.

BRIEF DESCRIPTION OF THE DRAWINGS

For a more complete understanding of the present invention and for further features and advantages, reference is made to the following description taken in conjunction with accompanying drawings, in which:

FIGS. 3A and 3B illustrate test mode commands, according to one embodiment of the invention;

FIGS. 7A and 7B include tables illustrating several examples of data expansion using the systems illustrated by FIG. 6, according to various embodiments of the invention;

FIGS. 8A-8H illustrate a variety of test data patterns as may be delivered to an integrated circuit from a test module, according to various embodiments of the invention;

FIG. 10 includes a table illustrating clock cycle-based command scheduling, according to various embodiments of the invention;

FIG. 11 illustrates a test mounting board including at least one test module and at least one mount configured to receive an integrated circuit, according to various embodiments of the invention;

FIG. 12 illustrates a test array including a plurality of test mounting boards, according to various embodiments of the invention;

FIG. 13 illustrates methods of testing an integrated circuit using a test module, according to various embodiments of the invention;

FIG. 14 illustrates methods of generating test data, according to various embodiments of the invention;

FIG. 15 illustrates methods of processing test results received from an integrated circuit, according to various embodiments of the invention;

FIG. 16 illustrates alternative methods of processing test results received from an integrated circuit, according to various embodiments of the invention;

FIG. 18 illustrates methods of command scheduling, according to various embodiments of the invention;

FIG. 19 illustrates methods of configuring a test array for testing a plurality of integrated circuits, according to various embodiments of the invention;

FIGS. 22A and 22B illustrate the application of the serial compression logic of FIG. 21;

DETAILED DESCRIPTION OF THE INVENTION

Figure 1:
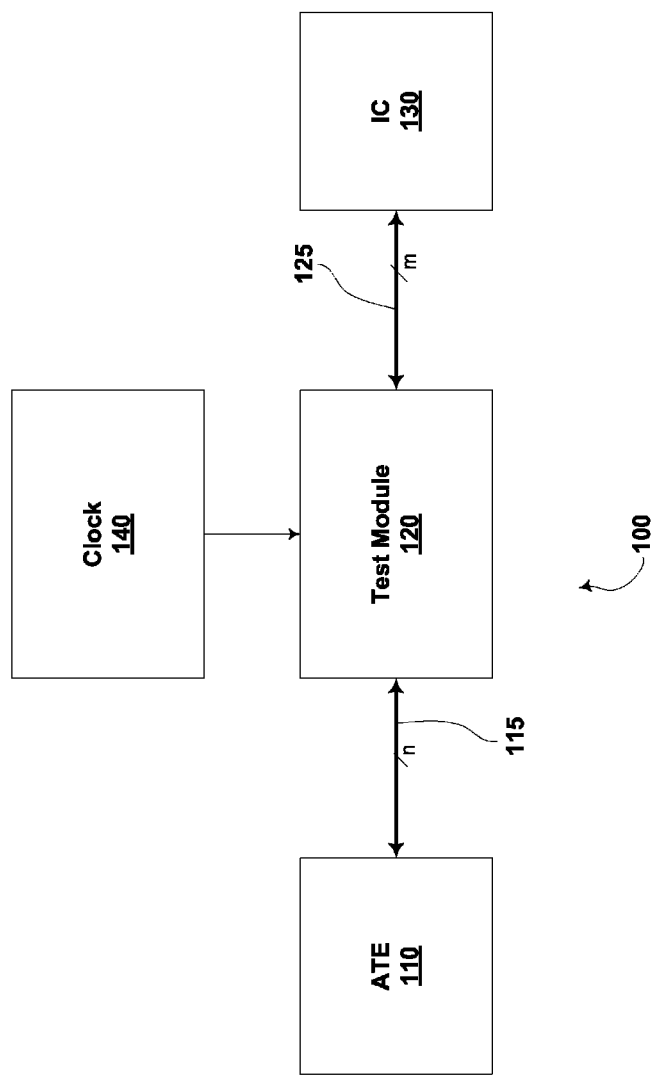
FIG. 1 is a block diagram of a test system, according to various embodiments of the invention.

Various embodiments of the invention include a test module configured to operate between automated testing equipment and one or more integrated circuits to be tested. The test module is configured to receive data, addresses and instructions from the automated testing equipment and to use these data and instructions to generate additional data and addresses. The test module is further configured to use the generated data and addresses to test the integrated circuit, to receive test results from the integrated circuit, and to report these test results to the automated testing equipment.

Communication between the automated testing equipment and the test module is optionally at a different clock frequency than communication between the test module and the integrated circuit being tested. As such, through the use of the test module, automated testing equipment configured to operate at a first frequency can be used to test an integrated circuit at a second higher frequency. For example, automated test equipment configured to test memory devices at 150 MHz may be used to test memory devices at 300 MHz or more.

The test module is configured to be placed in close proximity to or on the same silicon die as the integrated circuit to be tested. In part, because of the close proximity, the slew rate of the output signals to the integrated circuit can be faster than the slew rate of the input signals from the automated testing equipment to the test module. Various embodiments of the invention are, therefore, capable of delivering more precisely shaped test signals to the circuit to be tested, relative to the automated testing equipment. Further benefits of the fast slew rate include, for example, a lower probability of false test results, a lower probability of noise interference, and an increased overall reliability of the tests.

In order to test a memory at a frequency greater than communications are received from the automated testing equipment, the test module includes components configured to automatically generate memory addresses and test data responsive to an address and test data received from the automated testing equipment. As is described further herein, these components are optionally programmable to generate a variety of test patterns.

The test module further includes components configured to receive data from an integrated circuit being tested and either report a summary of these received data to the automated testing equipment, or compare the received data to expected data and report the results of this comparison to the automated testing equipment. Thus, the test module is configured to receive test results at a first frequency and communicate to the automated testing equipment in response to these results at a second, optionally lower, frequency.

In some embodiments, the test module further includes a command scheduler configured to communicate commands from the test module to the integrated circuit being tested at intervals appropriate for testing the integrated circuit. For example, if thorough testing of an integrated circuit requires that the integrated circuit receive two commands within three clock cycles, the command scheduler may be programmed to convey these commands with this interval, even though these commands may be received by the test module from the automated testing equipment at a different interval.

In some embodiments, the test module further includes a clock adjustment component configured to test aspects of an integrated circuit related to clock synchronization, for example set-up time and hold time. An adjustment may be made to the clock signal sent to the integrated circuit, for example in response to a signal received from the automated testing equipment. The adjustment optionally affects test signals sent to the integrated circuit uniformly, thereby enabling testing of parameters such as set-up time and hold-time of the integrated circuit as a whole.

In another embodiment, an adjustment may be made to the clock signal to individually control the output of individual data channels of the commands, addresses, and/or data patterns sent to the integrated circuit. Through individual adjustments of, for example, one bit or one address line alone, the test module is capable of testing the sensitivity of the integrated circuit to a variety of time critical and slew rate sensitive parameters, such as set-up and hold time.

For the purposes of illustration, the testing of memory devices is discussed herein. However, the scope of the invention and the examples provided are intended to extend to other types of integrated circuits including logic devices, processors, analog circuits, application specific integrated circuits (ASICs), communication circuits, optical circuits, or the like. Further, the scope of the invention is intended to apply to the testing of circuit assemblies such as system-on-chip (SoC), system-in-package (SiP), system-in-module (SiM), module-in-module (MiM), package-over-package (POP), package-in-package (PiP), or the like. Examples referring to one of these assemblies are intended to be applicable to others.

FIG. 1 is a block diagram of a Test System, generally designated 100, according to various embodiments of the invention. Test System 100 includes an automated test equipment (ATE) 110 configured for testing integrated circuits at a first frequency, and a Test Module 120 configured to serve as an interface between ATE 110 and an integrated circuit (IC) 130 to be tested. In some embodiments, Test Module 120 and IC 130 are included in the same electronic device. For example, Test Module 120 and IC 130 may both be within the same SiP. In some embodiments, Test Module 120 and IC 130 are included in the same silicon die. In some embodiments, Test Module 120 is a separate device from IC 130.

Test System 100 optionally further includes a Clock 140 configured to provide a clock reference signal to Test Module 120. ATE 110 is configured to communicate with Test Module 120 through an N-Channel Interface 115 at the first frequency, and Test Module 120 is configured to communicate with IC 130 through an M-Channel Interface 125. In some embodiments, the number of channels in N-Channel Interface 115 is the same as the number of channels in M-Channel Interface 125. In some embodiments, the number of channels in M-Channel Interface 125 is a multiple of the number of channels in N-Channel Interface. N-Channel Interface 115 and M-Channel Interface 125 can include, for example, a test pad, test probe, cable, test pin, or other connector. In some embodiments, M-Channel Interface 125 includes internal connections within a system-on-chip (SoC), system-in-package (SiP), system-in-module (SiM), module-in-module (MiM), package-over-package (POP), package-in-package (PiP), or the like. Test Module 120 is optionally physically detachable from IC 130 and from ATE 110.

ATE 110 is optionally a prior art automated testing equipment configured to test integrated circuits. For example, ATE 110 may include test equipment currently offered by Advantest Corporation of Tokyo, Japan, Teradyne, Inc. of Boston, Mass., or Agilent Technologies, Inc. of Palo Alto, Calif. ATE 110 is characterized by a maximum frequency at which it is configured to communicate with an integrated circuit during testing.

Typically, ATE 110 is programmable to perform specific testing routines as directed by a user. These testing routines include sending (i.e., writing) test data, commands and optionally addresses via N-Channel Interface 115. These test data, commands and addresses are received by Test Module 120. ATE 110 is further configured to receive (i.e., read) test results via N-Channel Interface 115, to compare the received results with expected results, and to report variations between the received and expected results.

In alternative embodiments, ATE 110 is configured to include Test Module 120 as a module. For example, in some embodiments, Test Module 120 is included in ATE 110 as a replaceable component that can be exchanged and/or upgraded as the technical requirements (e.g., testing frequency, form factor, command vocabulary, or the like) for testing evolve. Thus, in one embodiment, ATE 110 is configured to be upgraded by exchanging instances of Test Module 120.

Test Module 120 is configured to receive test data, commands, and optionally addresses from ATE 110 via N-Channel Interface 115 and to use this received information to generate additional test data and optionally additional addresses for testing of IC 130. For example, in some embodiments, Test Module 120 is configured to receive memory control commands, data for testing memory, and memory addresses from ATE 110. The received memory control commands, data and memory addresses are used to generate further data and further memory addresses for testing memory. The commands, further data and further memory address are communicated from Test Module 120 via M-Channel Interface 125 to IC 130.

Test Module 120 is further configured to receive (i.e., read) test results from IC 130 and to process these received test results. In some embodiments, Test Module 120 is configured to report the results of this processing to ATE 110. In some embodiments, Test Module 120 is configured to communicate a compressed version of the received test results to ATE 110. Further details of Test Module 120 are discussed elsewhere herein.

IC 130 is an integrated circuit to be tested via Test Module 120. IC 130 is not necessarily included as part of Test System 100 prior to testing. IC 130 is optionally a logic device such as an application specific integrated circuit (ASIC), a processor, a microprocessor, a microcontroller, a field programmable gate array (FPGA), a programmable logic device (PLD), a complex programmable logic device (CPLD), or the like. IC 130 may alternatively be implemented as an analog device, a module, a circuit board, or a memory device, etc.

As a memory device, IC 130 can be an IC memory chip, such as, for example, static random access memory (SRAM), dynamic random access memory (DRAM), synchronous DRAM (SDRAM), non-volatile random access memory (NVRAM), and read only memory (ROM), such as erasable programmable ROM (EPROM), electrically erasable programmable ROM (EEPROM), and flash memory, or any memory device operating under a suitable format or protocol, such as double-data rate (DDR) or DDR2. The memory device can be configured in various configurations (e.g., X32, X16, X8, or X4) and may comprise a plurality of memory cells arranged, for example, in rows and columns. The memory cells can be implemented using transistors, capacitors, programmable fuses, etc.

As a module, IC 130 can be a system-in-package (SiP), package-in-package (PiP), or system-on-chip (SoC). It also can be a combination of SoC, SiP and PiP. IC 130 may be disposed within suitable packaging, such as, for example, as a standard ball grid array (BGA) or thin quad flatpack (TQFP). The packaging may further utilize various surface mount technologies such as a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), to name but a few, and utilizing various leads (e.g., J-lead, gull-wing lead) or BGA type connectors.

Clock 140 is configured to provide a clock signal to Test Module 120 for use in communicating between Test Module 120 and IC 130. Clock Signal 140 is typically different from a clock signal used for communicating between ATE 110 and Test Module 120. Thus, N-Channel Interface 115 may operate at a different (e.g., higher) frequency than M-Channel Interface 125. The clock signal provided by Clock 140 is optionally a multiple of the clock signal used by ATE 110. Clock 140 can include a phase-locked loop, a crystal oscillator, or the like. The clock signal received from Clock 140 is typically synchronized with the clock signal used by ATE 110 using one of the various methods known in the art. Clock 140 is optional when Test Module 120 is configured to generate a clock signal, for use in communication with IC 130, based on a clock signal received from ATE 110. For example, in some embodiments, Test Module 120 includes logic configured to multiply a clock signal received from ATE 110 by a factor of 1.5, two or more.

Figure 2:
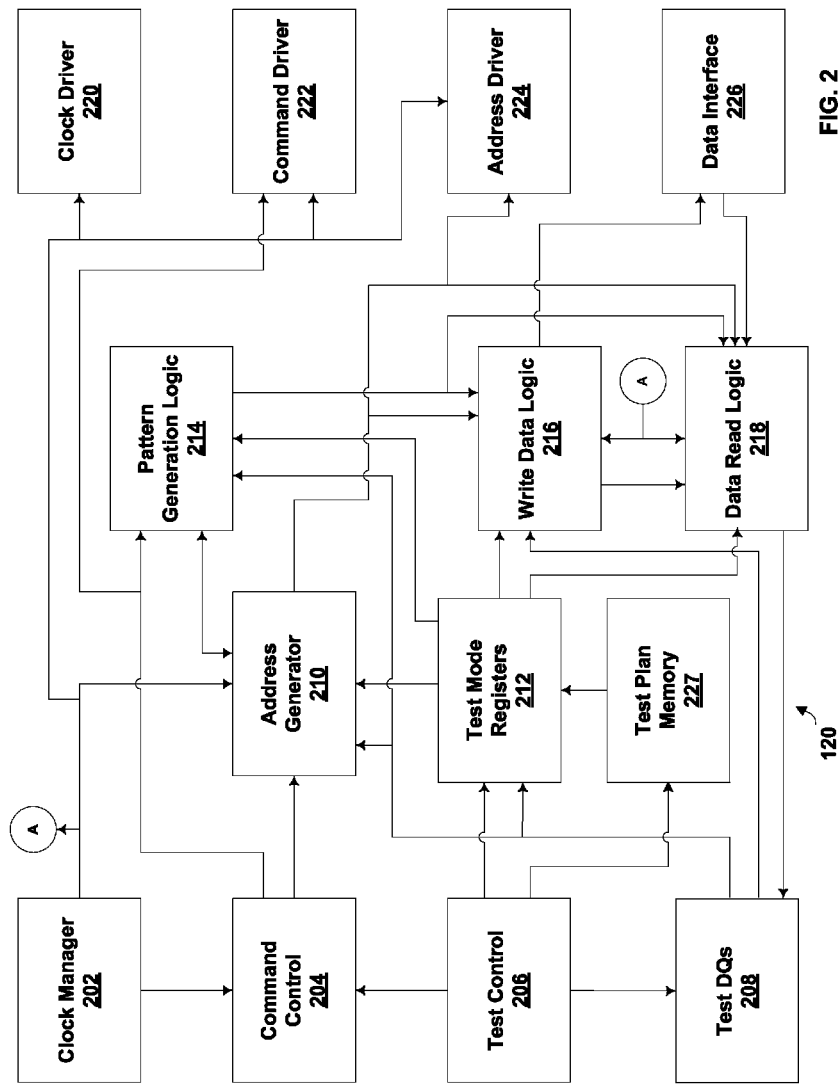
FIG. 2 is a block diagram of a test module, according to various embodiments of the invention.

FIG. 2 is a block diagram of Test Module 120, according to various embodiments of the invention wherein IC 130 is a memory device. The embodiments illustrated by FIG. 2 include several components configured to communicate with ATE 110. These components include a Clock Manager 202, a Command Unit 204, a Test Control 206, and Test DQs 208. The embodiments illustrated by FIG. 2 also include several components configured to communicate with IC 130. These components include a Clock Driver 220, a Command Driver 222, an Address Driver 224, and a Data Interface 226. Together, these components perform functions similar to those of a memory manager. Between those components configured to communicate with ATE 110 and those components configured to communicate with IC 130, Test Module 120 includes an Address Generator 210, a Pattern Generation Logic 214, Test Mode Registers 212, Write Data Logic 216, and Data Read Logic 218. The components illustrated in FIG. 2 may include software, hardware, firmware, or combinations thereof.

Clock Manager 202 is configured to receive a test clock (TCK) signal from, for example, ATE 110. This test clock signal is typically a clock signal generated by ATE 110 for the purposes of testing an integrated circuit. Clock Manager 202 is optionally also configured to receive a phase lock loop clock (PLLCK) clock signal from Clock 140. In response to the TCK and/or PLLCK signals, Clock Manager 202 generates one or more other clock signals (e.g., CK0, CK, CK\), some of which may have a frequency that is higher than the received test clock TCK signal. As such, Test Module 120 can be configured to test IC devices that operate at clock frequencies higher than the clock frequency of ATE 110. This allows IC devices to be thoroughly tested, for example, using older test equipment. The clock signals output from Clock Manager 202 may be provided to other components within Test Module 120. These components include Clock Driver 220, Command Driver 222, Address Driver 224, Address Generator 210, Write Data Logic 216 and Data Read Logic 218. The output of Clock Manager 202 can be communicated to IC 130 via Clock Driver 220.

Command Unit 204 is configured to receive various test functional signals (e.g., TCKE, TDQS, TCS\, TRAS\, TCAS\, TWE\, TBA[0:2], TA10), and to process or forward these functional signals to other components within Test Module 120. For example, Command Unit 204 is configured for generating command signals to be passed to IC 130 via Command Driver 222. These command signals include, for example, CKE, CS, RAS\, CAS\, WE\, BA[0:2]. In another example, Command Unit 204 is configured to receive data generation and address generation commands for use by Pattern Generation Logic 214 and Address Generator 210, respectively. Further details of the operation of Address Generator 210 and Pattern Generation Logic 214 are described elsewhere herein.

In some embodiments, the test functional signals received by Command Unit 204 include SET, LOAD, and CMD (Command). A 4-bit wide stream can be registered using a CMD pin as the input data source and the SET signal to register. For example, an Activate Row command can be a series of four serial bits b0011, a Read command can be b0101, and so on. The serial bits can be registered on the positive edge of TCK signal when the SET signal is high. In one embodiment, four registers and a 2-bit counter can be used to accept the CMD input.

Test Control 206 is configured to receive the TEST, SET and LOAD signals for placing the module into test mode, program test modes (or phases), and load or enable test addresses and/or test vectors. In addition, in some embodiments, Test Control 206 is further configured to store data scramble patterns, row address scramble patterns and column address scramble patterns. As is described further herein, these patterns are used to generate test addresses and test data. Test Control 206 is configured to provide one or more output signals to Test Mode Registers 212, which functions to store or forward the test codes, vectors, patterns, etc. for further processing or use as appropriate. For example, TEST, SET and LOAD signals may be used to convey an address generation pattern from ATE 110 to Test Module 120. The address generation pattern is stored in Test Mode Registers 212 and read by Address Generator 210 when needed. Likewise, TEST, SET and LOAD signals may be used to convey a data scramble pattern from ATE 110 to Test Mode Registers 212. This data scramble pattern is used by Write Data Logic 216 and Data Read Logic 218 as further described herein.

Test DQs 208 are further configured to receive address data from ATE 110 and to convey this address data to Address Generator 210 for use in generating additional addresses. Test DQs 208 are further configured to receive test data signals (e.g., TDQ[0:7]), from ATE 110. The received test data signals are processed or forwarded to other components within Test Module 120. These test data signals are optionally used to generate additional test data using Pattern Generation Logic 214 and Write Data Logic 216. For example, Write Data Logic 216 can use test data signals received via Test DQs 208 to generate data signals (e.g., DQ[0:31]), which are then provided to IC 130 via Data Interface 226.

Test DQs 208 are configured to receive both actual test data and test mode commands from ATE 110. For example, when the SET command is received by Test Control 206 a test mode command will be expected at Test DQs 208. When a LOAD command is received by Test Control 206, actual test data is expected at Test DQs 208.

FIGS. 3A and 3B illustrate test mode commands, according to one embodiment of the invention. These commands include Items 1 and 9 for No Test; Items 2 and 3 for loading row addresses; Items 5 and 6 for setting row counter least significant bits (LSB); Item 8 for setting row counter direction; Items 10 and 11 for loading column addresses; Items 13 and 14 for setting column counter LSB; and Item 16 for setting column counter direction. In FIG. 3B, Items 18 and 19 are commands configured for loading MRS (mode register set) data; Item 23 is for reading a chip identification; Item 26 is for loading data scrambling (generation) information; Item 27 is used to determine the form in which test results are reported from Test Module 120 to ATE 110; Item 30 is for loading further data generation information; and Item 31 is for controlling address and data generation for a specific class of memory architecture. Test Module 120 may also be configured to support enhanced MRS commands, mobile MRS commands, or the like.

Row counter LSB and column counter LSB are used to determine which row bits and which column bits are incremented first during address generation. For example, if the second bit of the row address is set as a row counter LSB then the associated row address will be incremented by two. If the third bit of the row address is set as the row counter LSB, then the associated row address will be incremented by four. The set row counter to count down command is used to determine whether the row address will be counted up or down. Setting of LSB to other than the first bit is optionally used when it is desirable to step to memory boundaries.

Returning to FIG. 2, Test DQs 208 are also configured to convey test results to ATE 110 from Test Module 120. For example, signals received from IC 130 via Data Interface 226 can be processed by Data Read Logic 218 and provided to Test DQs 208 for communication to ATE 110. The data communicated to ATE 110 via Test DQs 208 can include the full test results received from IC 130, a condensed version of the results received from IC 130, or a summary of the results (e.g., a pass or fail indication). The form of the data communicated depends on test criteria stored in Test Mode Registers 212 via Test Control 206.

Address Generator 210 is configured to receive signals from Clock Manager 202, Command Unit 204, Test DQs 208, and Test Mode Registers 212. Using this received information, Address Generator 210 is configured to generate test addresses (e.g., A[0:15]) for communication to IC 130 via Address Driver 224. These addresses are used to address IC 130. For example, in some embodiments, these addresses are used to direct the loading of data, via Data Interface 226, into IC 130. For example, data written to IC 130 from Data Interface 226 may be stored, within IC 130, at an address written to IC 130 from Address Driver 224. As is further described herein, the addresses generated by Address Generator 210 are optionally also provided to Pattern Generation Logic 214 for use in generating test data or interpreting data received from IC 130.

In some embodiments, Address Generator 210 includes a sequence pattern generator, such as that described in related U.S. application Ser. No. 10/205,883 entitled "Internally Generating Patterns For Testing In An Integrated Circuit Device," filed on Jul. 25, 2002, and related U.S. application Ser. No. 11/083,473 entitled "Internally Generating Patterns For Testing In An Integrated Circuit Device," filed on Mar. 18, 2005, both of which are assigned to the same assignee and incorporated by reference herein in their entirety.

Figure 4:
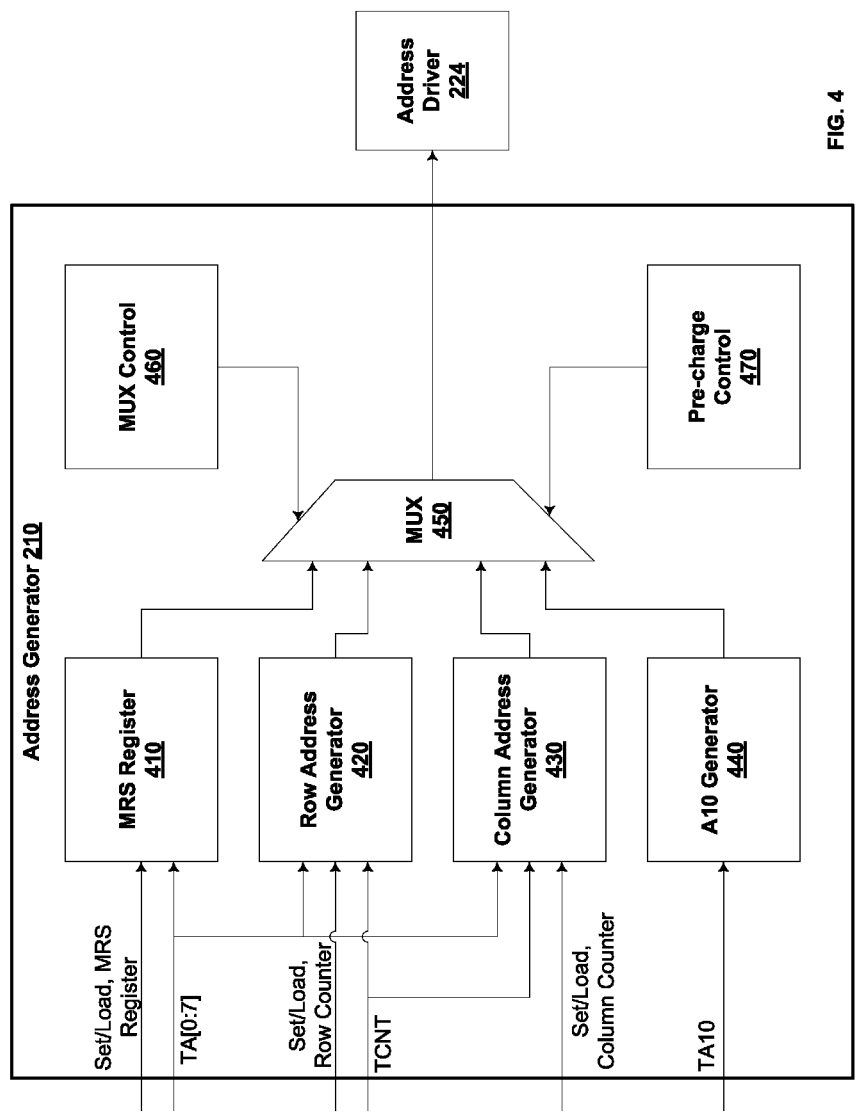
FIG. 4 illustrates further details of an address generator, according to various embodiments of the invention.

FIG. 4 illustrates further details of Address Generator 210, according to various embodiments of the invention. In these embodiments, Address Generator 210 includes an MRS Register 410, a Row Address Generator 420, a Column Address Generator 430, and an optional A10 Generator 440, each configured to provide data to a MUX 450. MUX 450 is controlled by a MUX Control 460, and may also receive input from a Precharge Control 470.

MRS Register 410 is configured to receive SET, LOAD, mode register set (MRS), and test address signals (TA[0:7]). Test address signals (TA[0:7]) are received through TDQ[0:7] of Test DQs 208. Row Address Generator 420, which receives the SET, LOAD, and TCNT signals and a row counter signal, is configured to generate a plurality of row addresses for use in testing IC 130. Column Address Generator 430, which receives the SET, LOAD, and TCNT signals and a column counter signal, is configured to generate a plurality of column addresses for use in testing memory device 130. A10 Generator 440 is configured to receive a TA10 signal. The TA10 signal is used to separately control an A10 bit. The A10 bit is a bit found on some types of memory capable of pre-charging. For example, if IC 130 is a DRAM, then the A10 Generator 440 may be configured for generating a bit to enable a DRAM auto-precharge, All-bank command.

MUX (multiplexer) 450 is configured to receive and multiplex the outputs of the MRS Register 410, Row Address Generator 420, Column Address Generator 430, and A10 Generator 440, under the control of MUX Control 460. The output of MUX 450 is an output of Address Generator 210 and is provided to Address Driver 224 for communication to IC 130. In some embodiments, the output of MUX 450 is also provided to Write Data Logic 216 and Data Read Logic 218 for generation and interpretation of test data.

Address Generator 210 is typically configured to generate more than one address for delivery to Address Driver 224 for each address received from ATE 110. For example, in some embodiments, Address Generator 210 is configured to receive a single base address from ATE 110 and generate a block of addresses in response. In some embodiments, Address Generator 210 is configured to generate two (the original plus one) address for each address received. For example, for each even address received, Address Generator 210 may be configured to generate a corresponding odd address. In various embodiments, Address Generator 210 is configured to generate 4, 8, 16, 32, 64, 128, or more addresses for each address received from ATE 110. In some embodiments, Address Generator 210 is configured to generate addresses sufficient to reach a next address boundary. For example, if the counting direction is up, the burst length is 4 and the first read address is at Col-0, then the column counter will jump to Col-4 for the next read address and generate four addresses (Col-0 to Col-3).

In some embodiments, Test Module 120 is configured to provide memory addresses to IC 130 in response to a memory access command received from ATE 110. For example, when an Active command is received from ATE 110 and scheduled to be communicated to IC 130, MUX Control 460 is configured to control MUX 450 such that address bits from Row Address Generator 420 will be communicated to Address Driver 224. Testing Interface 120 will send the Active command (CS/RAS/CAS/WE=0011) and the accompanying address bits A[0:13] (for 512 Mb×8 DRAM) to a DRAM under test (e.g., IC 130).

When a Read command is scheduled to be communicated, MUX Control 460 will use MUX 450 to select address bits from Column Address Generator 430 to be sent to Address Driver 224. Testing Interface 120 will send the Read command (CS/RAS/CAS/WE=0101) and the accompanying address A[0:9] (512 Mb×8 DRAM) and A10 (for auto-precharge or no auto-precharge). Similar events occur for Write and Load Mode Register operations that involve sending address bits. The operation of MUX Control 460 is typically responsive to the type of command being processed (e.g., Load Mode Register, Precharge, Active, Read, Write, Select, etc.).

In some embodiments, test column addresses can be incremented independently from the test row addresses. Row Address Generator 420 and Column Address Generator 430 are optionally configured to internally generate sequences of numbers for use as addresses during testing.

Referring again to FIG. 2, Test Mode Registers 212 are configured to store test mode data for use by Address Generator 210, Pattern Generation Logic 214, Write Data Logic 216 and Data Read Logic 218 during testing. For example, Test Mode Registers 212 are configured to receive a starting column address and/or a starting row address from Test DQs 208, and to receive test mode commands (such as those illustrated in FIGS. 3A and 3B) under the control of Test Control 206. During testing, these and other values are read from Test Mode Registers 212 in order to generate test addresses and test data.

In some embodiments, Test Mode Registers 212 are programmable using a Test Register Set command and programmed through test data signals TDQ0-TDQ7 of Test DQs 208. In a test mode, the inputs for TDQ0-TDQ7 signals can be used to read and write test data, set test mode codes, load row and column addresses, program row and column counter least significant bits (LSB), set data scramble patterns, set data generation logic, and load test data patterns, etc. In some embodiments, the registers within Test Mode Registers 212 can be set anytime. In some embodiments, a SET command at Command Unit 204 is set in a high state to load test mode commands and test mode data into Test Mode Registers 212.

In some embodiments, all or part of data scramble patterns, row address scramble patterns and column address scramble patterns are stored in a removable memory. For example, these patterns may be included in an EPROM configured to be plugged into Test Module 120 or plugged into a test mounting board configured to support one or more instances of IC 130. In these embodiments, the various scramble patterns can be programmed while external to Test Module 120. For example, in some embodiments, different EPROMs are programmed with different testing protocols and one of the different EPROMs is selected to be plugged into Test Module 120 depending on the protocol desired. In some embodiments, different EPROMs are programmed for testing different types of IC 130. In alternative embodiments, scramble patterns are included in removable memory other than EPROMs. For example, Test Mode Registers 212 can be included in ROM, FLASH, one time programmable logic, or the like.

Figure 5:
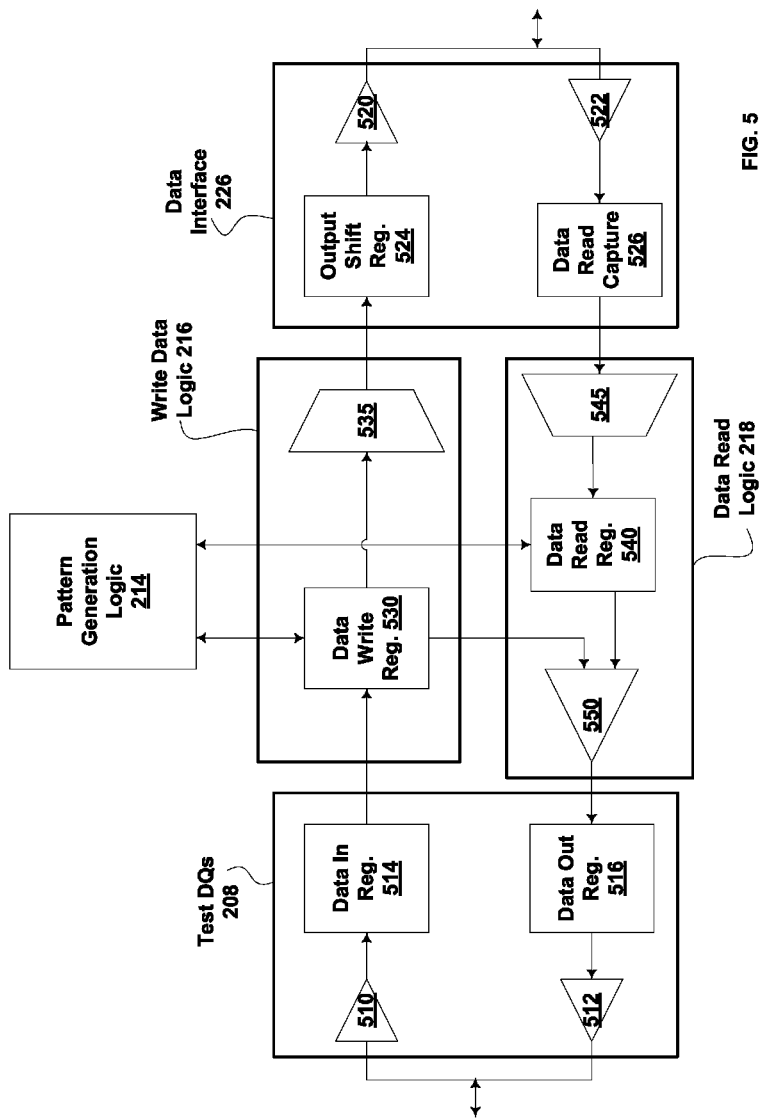
FIG. 5 illustrates further details of data paths used for writing data to, and reading data from, an integrated circuit, according to various embodiments of the invention.

Pattern Generation Logic 214, Write Data Logic 216 and Data Read Logic 218 are configured for generating test data to be written to IC 130 and for interpreting test results read from IC 130. As is further described herein, the generated test signals may include more data than received from ATE 110, may be responsive to data patterns stored in the interface, and/or be responsive to addresses, or the like. FIG. 5 illustrates further details of the data paths used for writing data to, and reading data from, IC 130, according to various embodiments of the invention.

In those embodiments illustrated in FIG. 5, Test DQs 208 include an Input Buffer 510, an Output Buffer 512, a Data In Register 514, and a Data Out Register 516. These buffers are configured to receive data from and send data to ATE 110, respectively. When data is received from ATE 110, the output of Input Buffer 510 is stored in Data In Register 514. Likewise, when data is ready for delivery to ATE 110 it is stored in Data Out Reg. 516 until read by ATE 110. In various embodiments, Test DQs 208 are configured to communicate 8, 16, or more bytes in parallel.

In those embodiments illustrated in FIG. 5, Data Interface 226 includes an Output Buffer 520, an Input Buffer 522, an Output Shift Register 524, and a Data Read Capture 526. Data to be written to IC 130 is collected in Output Shift Register 524 and then passed through Output Buffer 520. Data read from IC 130 is passed through Input Buffer 522 and captured by Data Read Capture 526. In typical embodiments, Data Interface 226 is configured to communicate data at a faster clock frequency than Test DQs 208.

In those embodiments illustrated by FIG. 5, Write Data Logic 216 includes a Data Write Register 530 and a MUX 535. Data Write Register 530 is configured to receive, for example, 8-bit data from Data In Register 514. The received data is expanded to generate additional data using a data scramble pattern under the control of Pattern Generation Logic 214 according to a data scramble pattern. In typical embodiments, several data are generated within Data Write Register 530 in parallel. For example, Data Write Register 530 may be configured to generate eight sets of data from eight original bits in parallel. These data are communicated to MUX 535. In various embodiments, MUX 535 receives 16, 32, 64 or more bits of data for each byte of data received by Test DQs 208 from ATE 110. Further details of the data generation process are discussed elsewhere herein.

In those embodiments illustrated by FIG. 5, Data Read Logic 218 includes a MUX 545, an optional Data Read Register 540, and an optional Comparison Unit 550. In some embodiments, Data Read Register 540 and MUX 545 are configured to perform the reverse of the process performed in Write Data Logic 216. For example, MUX 545 is configured to receive data from Data Read Capture 526 and pass the received data to one or more Data Read Registers 540. Data Read Register 540 is configured to use the same data scramble pattern as used by Data Write Register 530 to compress the received data in a process that is the reverse of that performed by Data Write Register 530. If the data received by Data Read Register 540 from MUX 545 is the same as the data generated by Data Write Register 530, then Data Read Register 540 will compress the data such that it is the same as that received by Data Write Register 530 from Data In Register 514. In some embodiments, this compressed data is passed directly to Data Out Register 516 for communication to ATE 110. In these embodiments, Comparison Unit 550 is optional.

Data Read Capture 526, MUX 545, Data Read Register 540, Comparison Unit 550 and Data Out Register 516 form a data path for reading data from IC 130 during testing. In some embodiments, the components in the read data path are configured to receive external data signals (DQ[0:31]) from IC 130, compress the signals into external test data signals (TDQ [0:7]), and return the external test data signals to the external test machine (e.g., ATE 110). In other embodiments, the components in the read data path are configured to receive external data signals (DQ[0:30]) from IC 130, to compare these signals with expected values, and to report results of these comparisons using part of TDQ[0:7].

The components in the data pathway configured to write data to IC 130 (e.g., Data In Register 514, Data Write Register 530, Pattern Generation Logic 214, MUX 535, and Output Shift Register 524) are configured to receive external test data signals (TDQ[0:7]) from ATE 110, expand the signals into external data signals (DQ[0:31]), and provide the external data signals to IC 130.

In some embodiments, the components of the write data path may receive bits of test data from the external test machine at the operating frequency of the test machine, generate multiple bits for each bit of data received from the test machine, and transmit the generated bits to IC 130 at the operating frequency of IC 130 (which can be higher than the frequency at which ATE 110 operates).

In one example, the components in the write data path may receive a bit of TDQ3 with a value of "1" from ATE 110 at a clock frequency of 100 MHz, generate a string of bits "1111" from that received bit by merely repeating the value multiple times, and then provide the string of bits to IC 130 as DQ12-DQ15 at a frequency of 200 MHz. In another example, the components in the write data path may receive a bit of TDQ3 with a value of "1" from ATE 110 at a clock frequency of 100 MHz, generate on-the-fly a string of bits "0101" from the received bit, and then provide the generated string of bits to IC 130 as DQ8-DQ11 at a frequency of 400 MHz. The generation of the string of bits of "0101" from a bit of "1" is accomplished using Pattern Generation Logic 214 which, for example, may include logic to "invert every odd bit" in a string of "1111." In other examples, each bit received at TDQ[0:7] is used to generate a burst of 4 bits, 8 bits, or more for each of DQ[0:31]. For example, a bit received at TDQ3 may be used to generate a burst of four bits at each of DQ12, DQ13, DQ14 and DQ 15. This burst of bits can include any of the possible four bit patterns, responsive to Pattern Generation Logic 214.

In one embodiment, the components of the read data path may receive bits of test result from IC 130 at the clock frequency of IC 130, translate strings of test result bits into a single bit, and provide the single test result bit to ATE 110 at the clock frequency of ATE 110. In one example, the components in the write data path may receive a test result bit string of "0011" for DQ16-DQ19 from IC 130 at a clock frequency of 400 MHz. The write data path components reduce this string to a value of either "0" or "1" depending on whether the string matches an expected test result, and provides the single bit ("0" or "1") to ATE 110 through TDQ5.

The ability of Testing Interface 120 to "expand" data received from ATE 110 and to "compress" data received from IC 130 provides a technical advantage in that IC 130 can be tested at its normal clock speed using instances of ATE 110 configured to operate at a lower clock speed.

In alternative embodiments, the compressed data generated by Data Read Register 540 is passed to Comparison Unit 550. In these embodiments, Comparison Unit 550 is configured to compare this data with a copy of the data received by Data Write Register 530 from Data In Register 514. Based on this comparison, Comparison Unit 550 is configured to output a value indicating whether the compared data matched or not, e.g., whether the test "Passed" or "Failed." Thus, if the data read from IC 130 through Data Read Capture 526 is the same as the data written to IC 130 through Output Shift Register 524, Data Out Register 516 will receive a value indicating "Passed" from Comparison Unit 550. If the read data is not the same as the written data, then Data Out Register 516 will receive a value indicating "Failed" from Comparison Unit 550. The comparison made by Comparison Unit 550 may be performed in parallel or in series.

In some embodiments, the value indicating "Passed" is a copy of the data originally received by Test Module 120 from ATE 110 and the value indicating "Failed" is the complement of this data. In some embodiments, the data originally received by Test Module 120 is stored within Test Module 120 for this purpose. In some embodiments, the original data is sent from ATE 110 to Test Module 120 twice so that it does not have to be stored in Test Module 120. The second set of data is optionally also expanded for use in comparison with data received from IC 130 by Comparison Unit 550. In some embodiments, the value indicating "Passed" is some other value communicated from ATE 130 to Test Module 120 for this purpose.

In some embodiments, Data Read Register 540 is optional and Comparison Unit 550 is configured to receive data directly from MUX 545. In these embodiments, the data that Comparison Unit 550 receives from Data Write Register 530 is a copy of the expanded output of Data Write Register 530 that was provided to MUX 535, rather than the input received from Data In Register 514. This copy of the expanded output is compared with the data received from MUX 545. In these embodiments, Comparison Unit 550 is configured to make a comparison using expanded data rather than compressed data. The output of Comparison Unit 550 reflects whether the comparison found a match or not. In these embodiments, the data read from IC 130 through Data Read Capture 526 does not have to be recompressed. The copy of the expanded output of Data Write Register 530 may have been stored within Test Module 120 or may be reproduced on demand from the original data received from Data In Register 514.

In alternative embodiments, Comparison Unit 550 is configured to receive data directly from Data Read Capture 526. In these embodiments, Comparison Unit 550 is configured to receive a copy of the output of MUX 535 and to compare this data with that received from Data Read Capture 526. In these embodiments, MUX 545 is omitted.

Pattern Generation Logic 214 includes the logic required to process (e.g., compress or expand) data within Data Write Register 530 and Data Read Register 540 according to a data scramble pattern. In some embodiments, the processing includes communication of the data to be processed to Pattern Generation Logic 214, for example, from Data Write Register 530. In these embodiments, the actual processing occurs within Pattern Generation Logic 214 and the results are communicated back to the component from which the data to be processed was received.

In alternative embodiments, Pattern Generation Logic 214 is configured to communicate a data scramble pattern, logical rules, or the like to Data Write Register 530 and Data Read Register 540. In these embodiments, the actual processing occurs at Data Write Register 530 and/or Data Read Register 540. For example, a data scramble pattern may be sent by Pattern Generation Logic 214 to Write Data Logic 216 and this data scramble pattern may be XOR'ed with the data received from Test DQs 208 for generating the output of Write Data Logic 216.

In some embodiments, Pattern Generation Logic 214 is configured to be loaded with data scramble patterns (via Test DQs 208) during or immediately prior to testing of IC 130. In alternative embodiments, Pattern Generation Logic 214 is pre-loaded with several data scramble patterns and one of the data scramble patterns is selected during or immediately prior to testing through the use of a test pattern number.

Pattern Generation Logic 214 is configured to receive data from Command Control 204, Test Mode Registers 212, Test DQs 208, Clock Manager 202, and Address Generator 210. In some embodiments, the generation of test data can be address dependent because Pattern Generation Logic 214 receives data from Address Generator 210. For example, different data scramble patterns can be used for data to be written to ODD and EVEN (column and/or row) addresses. In one embodiment, the address dependency of data generation is used in testing instances of IC 130 wherein the logic of actual physical storage is address dependent. For example, some memory devices use a first voltage signal for storing data at ODD column addresses and an inverted form of the first voltage signal for storing data at EVEN column addresses. Thus, the data 11111111 may be stored in actual physical storage as 10101010. Through address dependent data generation, Testing Interface 120 can be configured to run test patterns such that the actual physical storage is 11111111, 00000000, or any permutation thereof.

Figure 6:
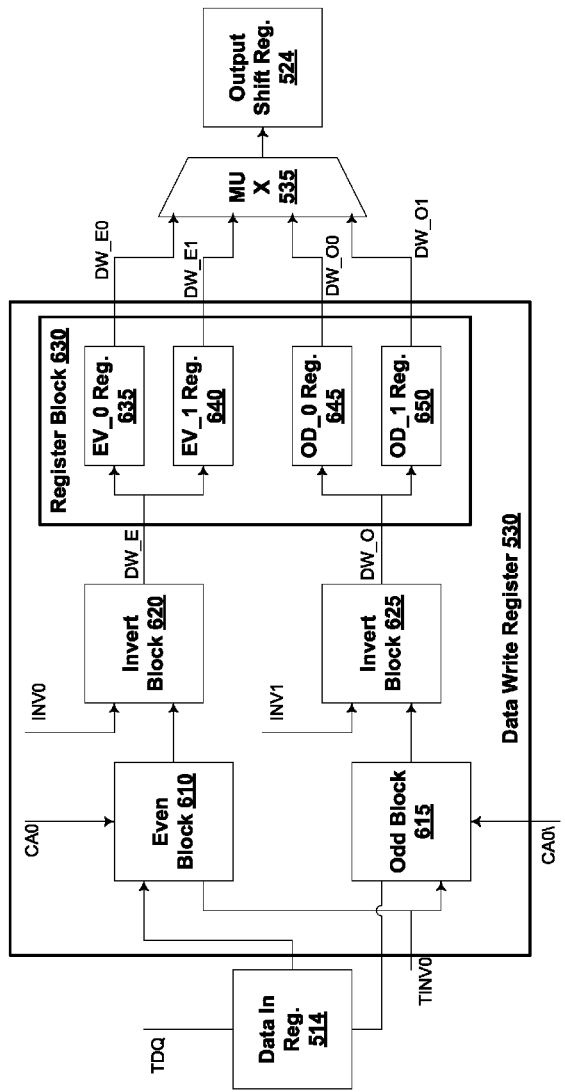
FIG. 6 is a block diagram illustrating further details of a data write register, according to various embodiments of the invention.

FIG. 6 is a block diagram illustrating further details of Data Write Register 530, according to various embodiments of the invention. A test data signal (TDQ) is received from ATE 110 at a clock frequency of ATE 110 and stored in Data In Register 514. From Data In Register 514, the TDQ signal is provided to an Even Block 610 and an Odd Block 615. Even Block 610 is configured to generate components of output data to be stored at even addresses and an Odd Block 615 is configured to generate components of the output data to be stored at odd addresses. Even Block 610 and Odd Block 615 also receive a test invert bit signal (TINV0) from Pattern Generation Logic 214. If this signal is HIGH then one of the bits within either Even Block 610 or Odd Block 615 will be inverted relative to the TDQ signal. Which bit is inverted is dependent on the state of a burst address LSB signal (CA0). In some embodiments, bits associated with ODD addresses will be inverted when TINV0 is HIGH. Even Block 610 receives burst address LSB signal (CA0) and Odd Block 615 receives the complementary signal (CA0\) from Pattern Generation Logic 214. CA0 is, for example, the LSB of the current column address. Even Block 610 and Odd Block 615 may be configured to generate their respective outputs in a serial manner using an XOR operation or a combination of latches and multiplexers. For example, a multiplexer may be configured to select an inverted output or non-inverted output of the latch responsive to CA0.

The outputs of Even Block 610 and Odd Block 615 are passed to an Invert Block 620 and an Invert Block 625, respectively. Invert Block 620 further receives an INV0 signal from Pattern Generation Logic 214, and Invert Block 625 further receives an INV1 signal from Pattern Generation Logic 214. Each of Invert Block 620 and Invert Block 625 are configured to invert or not invert the outputs of Even Block 610 and Odd Block 615, responsive to INV0 and INV1, respectively. For example, in some embodiments, when INV0 or INV1 are HIGH, the incoming data is inverted.

Invert Block 620 and Invert Block 625 are configured to output the signals data write even (DW_E) and data write odd (DW_O), which are provided to a Register Block 630. In some embodiments, when the INV0 and INV1 signals are HIGH, the DW_E and DW_O signals will each include both the original values and the complements of the outputs of Even Block 610 and Odd Block 615, respectively. When the INV0 and INV1 signals are LOW, the DW_E and DW_O signals will each include two copies of the original values of the output of Even Block 610 and Odd Block 615. The states of the INV0 and INV1 signals are dependent on the logic within Pattern Generation Logic 214 and, if Pattern Generation Logic 214 is programmed for a specific instance of IC 130, these states can be dependent on the architecture and topology of IC 130.

As is discussed elsewhere herein, the operation of Pattern Generation Logic 214 can be responsive to row address and/or column address. For example, in some embodiments, the following logic may be used to write a solid pattern in a memory array within IC 130: INV0=(RA0 XOR RA1) xor RA8. (Where RA0, RA1 and RA8 are row address bits, and XOR is the Exclusive OR function.) This means that when row address RA0=1 and RA1=0 and RA8=0, then INV0 will have a value of 1 data will be inverted in Invert Block 620. This inversion is optionally used to compensate for memory whose actual logical bit storage is address dependent. In most cases, INV0 will be the same as INV1, and therefore only one signal is required.

Typically, Data Write Register 530 will include a similar set of components configured to process each TDQ data element received from ATE 110 (e.g., TDQ0 through TDQ7). For example, if TDQ0 is equal to 1, CA0 (LSB of column address) is 0, and TINV0 is 1, then the input to Invert Block 620 will be 1 and the input to Invert Block 625 will be 0. (TINVO=1 means invert odd bit is active). Invert Block 620 and Invert Block 625 will invert the data again if the INV0 or INV1 signals are active. The value of the INV0 or INV1 signal depends on the output of Pattern Generation Logic 214.

In some embodiments, Register Block 630 includes a plurality of first-in-first-out (FIFO) registers configured to receive DW_E and DW_O. As illustrated in FIG. 6, these FIFO registers can include EV__0 Register 635, EV__1 Register 640, OD__0 Register 645, and OD__1 Register 650. EV__0 Register 635 and EV__1 Register 640 are configured for processing data received from Invert Block 620 and to be included in even bits of the output of Test Module 120, while OD__0 Register 645 and OD__1 Register 650 are configured for processing the corresponding odd bits. EV__0 Register 635 and EV__1 Register 640 are configured to store data write even 0 (DW_E0) and data write even 1 (DW_E1) signals from the DW_E signal. OD__0 Register 645 and OD__1 Register 650 are configured to store data write odd 0 (DW_O0) and data write odd 1 (DW_O1) signals from the DW_O signal. These DW_E0, DW_E1, DW_O0, and DW_O1 signals are provided in parallel to MUX 535. MUX 535 is configured to generate a serial stream from these parallel signals. The serial stream is provided to IC 130 as a sequence of data (e.g., 4 bits) in a data signal (DQ) via Output Shift Register 524. Thus, in the embodiments illustrated by FIG. 6, one bit of TDQ data from ATE 110 results in 4 bits of DQ data conveyed to IC 130.

As previously described in U.S. patent application Ser. No. 11/207,581 entitled "Architecture and Method for Testing of an Integrated Circuit Device," components similar to those illustrated in FIG. 6 may be included in the read data path of Testing Interface 120. In some embodiments, if the test data provided to IC 130 is the same as that received from IC 130, then Test Module 120 is configured to pass back to ATE 110 the same data that Test Module 120 originally received from ATE 110, and if the data received from IC 130 is not the same as that provided to IC 130, then Test Module 120 is configured to pass to ATE 110 the complement of the data that Test Module 120 originally received from ATE 110.

FIG. 7A and FIG. 7B include tables illustrating several examples of data expansion using the systems illustrated by FIG. 6. These tables include a TDQ Column 710 representing data bits received from Data In Register 514, a CA0 column 720 indicative of the CA0 and CA0\ values received by Even Block 610 and Odd Block 615, and an Even Data Bit Column 730 representative of whether the first bit is associated with an even or odd address. The tables further include a Four-Part Column 740 indicative of the outputs of Register Block 630 (e.g., DW_E0, DW_E1, DW_O0, and DW_O1). In FIG. 7A Four-Part Column 740 is representative of a default mode wherein TINVO is LOW, and in FIG. 7B Four-Part Column 740 is representative of a default mode wherein TINVO is HIGH. Finally, the tables included in FIGS. 7A and 7B include a Four-Part Column 750 representative of the four DQ output values provided to Output Shift Register 524.

FIGS. 8A-8H illustrate a variety of test data patterns that may be delivered to IC 130 from Test Module 120, according to various embodiments of the invention. FIGS. 8A and 8B include test data patterns that result in uniform arrays of bits, e.g., all 1 or all 0. FIGS. 8C and 8D include test data patterns having single inversions, e.g., every other bit is inverted. FIGS. 8E and 8F include test data patterns having dual inversions, e.g., every other pair of bits is inverted. And FIGS. 8G and 8H include test data patterns having quad inversions, e.g. every other set of four bits is inverted. Other test data patterns result in checkerboard, column stripe, row stripe, double column, double row, or similar bit storage within IC 130.

The actual physical storage pattern of test data that occurs in IC 130 may be different from the bit pattern provided to IC 130. For example, some types of memory storage use different tables for even and odd column addresses. In these memories, the test data pattern of FIG. 8C may result in a table of all ones corresponding to the even column addresses and a table of all zeros corresponding to the odd column addresses (assuming the first bit of the pattern is destined for an even column address). If the test data pattern of FIG. 8D were used, the first table would be all zeros and the second table would be all ones. Further, in these memories, the test data patterns of FIGS. 8E and 8F result in a checkerboard pattern within each of the two tables.

In some memories, as discussed elsewhere herein, some types of memory employ an architecture wherein the logic of actual physical storage of data is address dependent. For example, a logical 1 may be represented by a HIGH voltage in even address columns (and/or rows) and by a LOW voltage in odd address columns (and/or rows). In these types of memory, the data test patterns of FIGS. 8A and 8B result in a checkerboard of voltage values, while the test data patterns of FIGS. 8C and 8D result in an array of memory cells filled with the same actual voltage values. Because the generation of test data within Test Module 120 can be column address and/or row address dependent, Test Module 120 is capable of applying desirable test patterns to types of memory wherein the actual physical storage is address dependent.

Returning to FIG. 2, Clock Driver 220 is configured to provide a clock signal to IC 130. This clock signal is typically generated using Clock Manager 202 and may be faster than a clock frequency received from ATE 110.

Command Driver 222 is configured to convey commands received from Command Control 204 to IC 130. For example, Command Driver 222 may be configured to provide LOAD, READ, PRECHARGE or similar commands to an instance of IC 130 that includes a memory device. In some embodiments of the invention, Command Driver 222 includes a scheduler configurable to control the timing of commands (or data) communicated from Test Module 120 to IC 130. For example, it may be desirable to test the ability of IC 130 to accept commands at a predefined rate.

Figure 9:
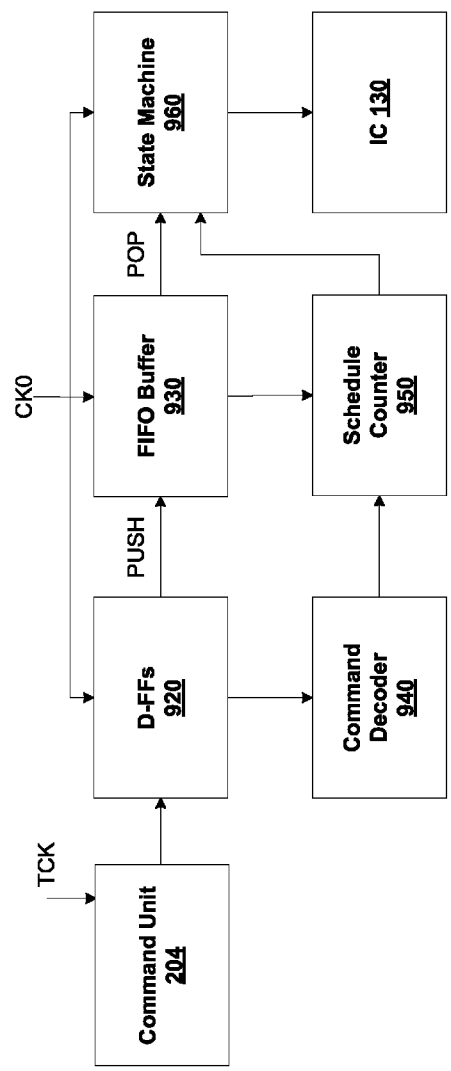
FIG. 9 illustrates an embodiment of a command driver configured to schedule delivery of commands to an integrated circuit, according to various embodiments of the invention.

FIG. 9 illustrates an embodiment of Command Driver 222 configured to schedule delivery of commands to IC 130. This embodiment includes a set of D-FFs (flip-flops) 920, a FIFO (first-in-first-out) Buffer 930, a Command Decoder 940, a Schedule Counter 950, and a State Machine 960. D-FFs 920 are asynchronous flip-flops configured for synchronizing delivery of commands received through Command Control 204 at the frequency of ATE 110 (TCK) with the clock frequency of Test Module 120 (CK0). CK0 may be two or more times greater than TCK. Synchronization with as few as two D-FFs is possible in embodiments where CK0 is synchronized with TCK by Clock Manager 202.

FIFO Buffer 930 is configured to store commands received from D-FFs 920 until the commands are ready for communication to IC 130. FIFO Buffer 930 can be, for example a 16 deep FIFO buffer. Commands are also decoded in Command Decoder 940 and passed to Schedule Counter 950. Schedule Counter 950 determines, using a table lookup, how may clock cycles should be allowed to pass between a particular command and the preceding command. The preceding command is optionally read by Schedule Counter 950 from FIFO Buffer 930. When a command is POPed from FIFO Buffer 930, it is received by State Machine 960, which is configured to wait the number of clock cycles determined by Schedule Counter 950 before conveying the command to IC 130.

Programmed delays can be set in terms of clock ticks. Thus, some commands may cause a delay of 1, 2, 3, 4, or more clock ticks before the next command is communicated to IC 130. Actual delay times between commands can be controlled by setting a delay in terms of clock ticks or by changing the frequency of the clock used for communication between Test Module 120 and IC 130.

FIG. 10 includes a table illustrating clock cycle based command scheduling, according to various embodiments of the invention. Within this table, a Parameter Column 1010 includes several different command sets as may be defined in State Machine 960. For example, the timing characteristics of an Active command, followed by a Read/Write command, are shown in the third row. The default clock period (tCK) is 3.75 nanoseconds (ns) while other times are expressed as multiples of tCK. Typically, tCK is the clock period used for communication between Test Module 120 and IC 130. The data shown is applicable to a specific type of SDRAM (Synchronous Dynamic Random Access Memory). Other clock speeds and delays may be used in alternative embodiments. Scheduling can also be employed, for example, to reduce the effects of latency within Test Module 120.

Referring again to FIG. 2, Address Driver 224 is configured to provide addresses to IC 130. Typically, these addresses are for reading or writing data through Data Interface 226. Data Interface 226 is configured to convey data between Testing Interface 120 and IC 130. In some embodiments, Data Interface 226 includes test pads, contact pins, sockets, or the like, configured for making electrical contact with IC 130.

FIG. 11 illustrates a Test Mounting Board 1110 including at least one Test Module 120 and at least one Mount 1120 configured to receive IC 130, according to various embodiments of the invention. Test Mounting Board 1110 can include a printed circuit board module, or the like. In some embodiments, Test Module 120 is implemented as a 10×10 mm 144 pin binary gate array (BGA) and Mount 1120 is an SDRAM BGA socket.

FIG. 12 illustrates a Test Array 1210 including a plurality of Test Mounting Boards 1110, according to various embodiments of the invention. In various embodiments, Test Array 1210 includes 2, 4, 8, 16, 32 or more of Test Mounting Boards 1110. Test Array 1210 further optionally includes a Memory 1220 configured to store test parameters and electronically coupled to each of the Test Mounting Boards 1110. For example, in various embodiments, Memory 1220 includes a data scramble pattern, a column address scramble pattern, a row address scramble pattern, other testing parameters, and/or the like. Memory 1220 is typically a non-volatile memory such as a static RAM or FLASH. Memory 1220 is optionally detachable.

FIG. 13 illustrates methods of testing IC 130 using Test Module 120, according to various embodiments of the invention. In these methods, Test Module 120 is connected to ATE 110 and IC 130, and configured to perform tests specific to IC 130. These tests include Test Module 120 receiving test signals from ATE 110, generating test addresses and test data based on the receive test signals, sending the generated test signals to IC 130, receiving test results from IC 130, and reporting back to ATE 110.

More specifically, in an Attach ATE Step 1310, Test Module 120 is electronically coupled to ATE 110 through N-Channel Interface 115. In some embodiments, this coupling includes connecting Test Module 120 to a standard test probe included in ATE 110. In some embodiments, this coupling includes coupling ATE 110 to a printed circuit board on which Test Module 120 is mounted.

In an Attach IC Step 1320, Test Module 120 is electronically coupled to one or more integrated circuits to be tested, e.g., IC 130. This coupling may take place through M-Channel Interface 125 and/or Test Array 1210. For example, in some embodiments, Attach IC Step 1320 includes plugging a plurality of ICs 130 into Mounts 1120 within Test Array 1210. In some embodiments, this plurality of ICs 130 includes a plurality of memory devices.

In a Configure Test Module Step 1330, Test Module 120 is configured to perform tests on IC 130. The configuration may include designation of a clock frequency for communicating with IC 130 that is different from a clock frequency used for communications between ATE 110 and Test Module 120. The configuration can further include specification of parameters for generating test addresses and test data within Test Module 120 for use in testing IC 130. In some embodiments, configuring Test Module 120 includes selecting of one of several alternative predetermined testing configurations. In some embodiments, configuring Test Module 120 includes coupling a non-volatile memory, having stored therein testing parameters, to Test Module 120. In some embodiments, Configure Test Module Step 1330 includes communicating configuration commands and data from ATE 110 to Test Module 120. These data are optionally stored in Test Mode Registers 212.

Configure Test Module Step 1330, Attach IC Step 1320 and Attach ATE Step 1310 are optionally performed in alternative orders.

In a Receive Signals Step 1340, Test Module 120 receives signals from ATE 110 through N-Channel Interface 115. These signals are received at a first clock frequency and may include commands for IC 130, addresses and test data. Typically, the received test signals are dependent on a setup of ATE 110.

In a Generate Step 1350, Test Module 120 is used to generate test addresses and test data responsive to the signals received in Receive Signals Step 1340 and the configuration specified in Configure Test Module Step 1330. Generate Step 1350 typically includes use of Address Generator 210 to generate test addresses, and use of Pattern Generation Logic 214 and Write Data Logic 216 to generate test data.

In various embodiments, Generate Step 1350 results in 2, 4, 6, 8 or more data elements for each data element received from ATE 110 in Receive Signals Step 1340. Generate Step 1350 optionally includes generation of test data responsive to address data. For example, the generation process may be different for data to be stored at an EVEN address as compared to data to be stored at an ODD address. The generated test data is optionally configured to result in a specific data pattern within IC 130. These patterns may include all ones, all zeros, checkerboard, inversion of every other bit, inversion of every other bit pair, alternative columns or alternative rows, or the like.

In a Send Test Signals Step 1360, test data generated in Generate Step 1350 are sent from Test Module 120 to IC 130, for example, using M-Channel Interface 125 and at a second clock frequency. The second clock frequency is optionally faster than the first clock frequency. In some embodiments, Send Test Signals Step 1360 includes scheduling of the delivery of commands from Test Module 120 to IC 130.

In an optional Receive Results Step 1370, test results are received by Test Module 120 from IC 130, for example, via M-Channel Interface 125. These test results are in response to the test signals sent in Send Test Signals Step 1360.

In an optional Report Step 1380, the received test results are processed by Test Module 120 and a report is provided to ATE 110. In some embodiments, this processing includes an inverse of the data generation process used in Generate Step 1350. In some embodiments, this processing includes comparing the received test results with expected test results. The report provided to ATE 110 can include data indicating "Pass" or "Fail," the data expected by ATE 110 or the complement of this data, or the like.

In an optional Detach IC Step 1390, IC 130 is detached from Test Module 120. Typically, IC 130 is configured to operate in a normal mode separate from Test Module 120. Test Module 120 is configured to receive different instances of IC 130 and to repeat the methods illustrated by FIG. 13 on each instance.

FIG. 14 illustrates methods of generating test data, according to various embodiments of the invention. These methods may be included in, for example, Generate Step 1350 of FIG. 13. In the methods illustrated, data generation is responsive to the configuration of Test Module 120 as determined in Configure Test Module Step 1330, as well as addresses and test data received from ATE 110.

In a Receive Input Step 1410, Test Module 120 receives test data, and optionally a test address, from ATE 110. The received test data can include a single bit, an 8-bit byte, a 16-bit word, a pair of 8-bit bytes, or the like. The received data is optionally stored in an input buffer, such as Data In Register 514. This test data is received at a first clock frequency.

In an optional Address Based Inversion Step 1420, a bit of the data received in Receive Input Step 1410 is duplicated. This duplication results in two instances of the bit (the original and the new instance). One, both or neither of the two instances are then inverted responsive to address data. For example, in some configurations of Test Module 120 the copy of the bit to be stored at an even address is inverted and the copy to be stored in an odd address is not inverted.

Address Based Inversion Step 1420 is optionally performed using Even Block 610 and Odd Block 615 as illustrated in FIG. 6. Address Based Inversion Step 1420 is typically applied in parallel to each bit of data received in Receive Input Step 1410. Address Based Inversion Step 1420 results in a doubling of the number of test data bits.

In a Pattern Based Inversion Step 1430, each available test bit is duplicated to generate two instances of that bit. One, both or neither of the two instances are then inverted in response to a test pattern. For example, in some embodiments, Invert Block 620 and Invert Block 625 are each used to duplicate a bit and invert the new instance of that bit responsive to INV0 and INV1, respectively. INV0 and INV1 are received from Pattern Generation Logic 214. The results of Pattern Based Inversion Step 1430 are optionally stored in a latch or a register block such as Register Block 630.

Address Based Inversion Step 1420 and Pattern Based Inversion Step 1430 are optionally performed in different orders. Together these steps result in a quadrupling of the available test data. For example, 8 bits of test data received from ATE 110 will result in 32 bits of available test data. In some embodiments, one or both of these steps are performed additional times in order to generate further data.

In a Serialize Step 1440, bits generated using Address Based Inversion Step 1420 are serialized using a multiplexer, such as MUX 535. The serialization process results in an ordered sequence of bits. This ordered sequence is optionally stored in Output Shift Register 525.

In a Deliver Step 1450, the ordered sequence of bits is delivered to an integrated circuit being tested, e.g., IC 130. This delivery is at a second clock frequency, which is optionally different (e.g., faster or slower) than the first clock frequency of Receive Input Step 1410.

FIG. 15 illustrates methods of processing test results received from IC 130, according to various embodiments of the invention. In these embodiments, the test results are subject to an approximate inverse of the data generation process discussed, for example, in relation to FIG. 14.

In a Receive Test Result Step 1510, Test Module 120 receives data from IC 130. This data is responsive to test data previously provided to IC 130, for example through the methods illustrated in FIGS. 13 and 14. In some instances, the data may be received in response to a READ command sent to IC 130. The received data is received at a first clock frequency.

In a Serial Compress Step 1520, the received data is serially compressed based on inversion signals received from Pattern Generation Logic 214. For example, in some embodiments, the received data is compressed responsive to INV0 and INV1 signals. Serial Compress Step 1520 reduces the number of bits included in the received data by a factor of two times, and may be performed using an inverse of invert Block 620 and Invert Block 625.

In an optional Serial Compress Step 1530, received data is further compressed in response to address information. For example, data received from an ODD address may be compressed using different logic than data received from an EVEN address. Serial Compress Step 1530 may be performed using an inverse of Even Block 610 and Odd Block 615, and result in a further reduction of the data by a factor of two times.

Serial Compress Step 1520 and Serial Compress Step 1530 are optionally performed in alternative orders. Together, these steps result in a compression of the received data by a factor of four. For example, if 32 bits are received from IC 130, these steps will result in 8 bits of compressed data. Either of these steps may be repeated in order to achieve greater compression ratios.

In a Report Step 1540, the compressed data generated using Serial Compress Step 1520 and Serial Compress Step 1530 is communicated to ATE 110. This communication is optionally at a different clock frequency than the first clock frequency.

FIG. 16 illustrates alternative methods of processing test results received from IC 130, according to various embodiments of the invention. In these embodiments, the test results are compared with an expected result and an output of this comparison is used to communicate to ATE 110. The comparison can be made with data as it is received from IC 130, with the data received from IC 130 following one compression step (e.g., Serial Compress Step 1520 or Serial Compress Step 1530), or with the data received from IC 130 following more than one compression step. The communication to ATE 110 can include a value indicating "Passed" or "Failed," or alternatively the data expected by ATE 110.

In a Receive Test Result Step 1610, Test Module 120 receives data from IC 130. This data is responsive to test data previously provided to IC 130, for example through the methods illustrated in FIGS. 13 and 14. In some instances, the data may be received in response to a READ command sent to IC 130. The received data is received at a first clock frequency.

In an Access Expected Result Step 1620, Test Module 120 accesses an expected result. The expected result may be different depending on whether the data received in Receive Test Result Step 1610 is be to compressed prior to comparison with the expected result. For example, if the received data is to be compared prior to any compression, then the expected result may be a copy of data sent from Test Module 120 to IC 130, e.g., in Report Step 1380 or Deliver Step 1450. This copy may have been previously stored in Test Module 120 or may be regenerated when needed as part of Access Expected Result Step 1620. In another example, if the received data is to be compared following one or more compression steps, then the expected data may be a copy of data at an appropriate stage of the methods illustrated by FIG. 14. This copy may have been previously saved or may be reproduced on the fly from data originally received from ATE 110, e.g., in Receive Input Step 1410.

In some embodiments, Access Expected Result Step 1620 includes receiving an expected result from ATE 110. For example, an expected result may be loaded into Test Module 120 from ATE 110 using Test DQs 208 and a command specific to this operation. These embodiments may be advantageous when the result received back from IC 130 is expected to be different from those sent to IC 130. In some embodiments, loading of an expected result from ATE 110 to Test Module 120 includes using a specific Expected Data Load command or a dedicated input.

In a Compare Step 1630, Comparison Unit 550 is used to compare the expected result accessed in Access Expected Result Step 1620 with the data received from IC 130 (or a compressed version thereof).

In a Report Step 1640, the output of the comparison made in Compare Step 1630 is used for communicating with ATE 110. In some embodiments, the output is used to determine if a value indicating "Failed" or "Passed" should be sent to ATE 110. In some embodiments, a copy of the expected data is sent to ATE 110 if the output of Compare Step 1630 indicates that the expected data was received from IC 130, and the complement of the expected data is sent to ATE 110 if the output of Compare Step 1630 indicates that the expected data was not received from IC 130.

The methods illustrated by FIG. 15 and FIG. 16 are optionally used in various combinations. For example, one compression step may be followed by a comparison with expected data. The report provided to ATE 110 from IC 130 is optionally provided at a different frequency than the data received by Test Module 120 from IC 130.

Figure 17:
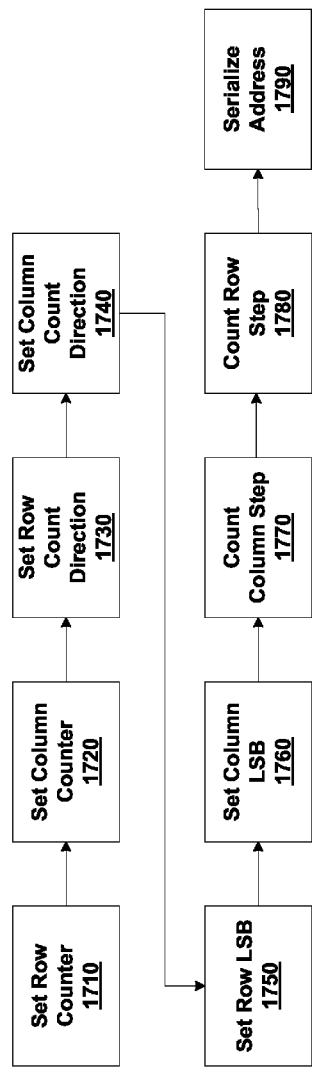
FIG. 17 illustrates methods of generating address data, according to various embodiments of the invention.

FIG. 17 illustrates methods of generating address data, according to various embodiments of the invention. These methods may be performed, for example, using Address Generator 210.

In a Set Row Counter Step 1710, an initial value of a row counter is set within Test Module 120. This initial value may be loaded into Test Module 120 using Test DQs 208 and an appropriate command at Command Control 204. Alternatively, this initial value may be loaded into Test Module 120 by coupling a non-volatile memory to Test Module 120, the non-volatile memory having the initial value pre-loaded. In some embodiments, the initial row value is configured to indicate a memory address within IC 130 at which initial test data will be stored.

In a Set Column Counter Step 1720, an initial value of a column counter is set within Test Module 120. This step can be performed in manners similar to that of Set Row Counter Step 1710. In some embodiments, the initial column value is configured to indicate a memory address within IC 130 at which initial test data will be stored.

In a Set Row Count Direction Step 1730, a row count direction is set within Test Module 120. This step can be performed in manners similar to that of Set Row Counter Step 1710. The count direction can be "positive" for counting up or "negative" for counting down.

In a Set Column Count Direction Step 1740, a column count direction is set within Test Module 120. This step can be performed in manners similar to that of Set Row Counter Step 1710. The count direction can be "positive" for counting up or "negative" for counting down.

In a Set Row LSB Step 1750, an LSB (least significant bit) for row counting is set. This step can be performed in manners similar to that of Set Row Counter Step 1710. The LSB is the bit that will be changed first in the counting process. If the lowest value bit is the LSB, then counting will occur by one. If the next bit is set as the LSB, then counting will occur by two, and if the next bit after that is set as the LSB, then counting will occur by 4, etc.

In a Set Column LSB Step 1760, an LSB for column counting is set. This step can be performed in manners similar to that of Set Row Counter Step 1710. In a Count Row Step 1770, a row address is changed responsive to the values set in Steps 1710, 1730 and 1750. In a Count Column Step 1780, a column address is changed responsive to the values set in Steps 1720, 1740 and 1760. In a Serialize Address Step 1790, the changed column address and the changed row address are serialized to form a complete address that may be used to access IC 130.

In various embodiments, one or more of the steps illustrated in FIG. 17 are optional. For example, by default count directions may be always positive, the row and/or column LSBs may always be the lowest value bit, and the initial values of the row and/or column counters may be equal to zero or one.

FIG. 18 illustrates methods of command scheduling, according to various embodiments of the invention. In these methods, commands are received by Test Module 120 for delivery to IC 130. These commands are typically received from ATE 110 at a different (e.g., slower) clock frequency than they are delivered from Test Module 120 to IC 130. In order to control the timing of delivery of the commands to IC 130, the commands may be temporally held in Test Module 120 and delivered according to a delivery schedule. The methods illustrated by FIG. 18 allow a user of Test Module 120 to test the ability of IC 130 to receive and respond to commands at specific rates.

In a Receive Command Step 1810, Test Module 120 receives a command from ATE 110. The received command may include, for example, a Read command, a Write command, an Active command, a Refresh command, a Precharge command, or the like.

In a Store Command Step 1820, the received command is stored. In some embodiments, the command is stored in a FIFO buffer, e.g., FIFO Buffer 930, following temporary storage in a D-flip-flop. The D-flip-flop, e.g., D-FFs 920, is typically running at a second clock frequency synchronized with the first clock frequency. In some embodiments, the second clock frequency is at least two times greater than the first clock frequency. In various embodiments, the FIFO buffer is configured to store 4, 8, 16, 32 or more commands.

In a Determine Command Delay Step 1830, the delay required for the received command is determined. The amount of delay is typically measured in clock cycles of the second clock frequency. The amount of delay is optionally dependent on a previously received command. For example, a delay between a Precharge command and a Read command may be different from a delay between a Read command and a Precharge command. Further examples of command delays are illustrated in FIG. 10.

In some embodiments, Determine Command Delay Step 1830 includes using Command Decoder 940 to decode the received command and Schedule Counter 950 to determine a proper delay. Schedule Counter 950 is typically configured to look up delay times in a table similar to that shown in FIG. 10. This data is optionally stored within Test Module 120 or in a memory accessible to Test Module 120. Schedule Counter 950 is configured to receive the preceding command from FIFO Buffer 930.

In a Retrieve Command Step 1840, the command received from ATE 110 is POPed from FIFO Buffer 930 and loaded into State Machine 960.

In a Delay Step 1850, the received command is held in State Machine 960 until the proper delay time has passed, as determined by an input from Schedule Counter 950. In a Deliver Step 1860, following the proper delay time, the received command is passed from Test Module 120 to IC 130.

FIG. 19 illustrates methods of configuring a test array for testing a plurality of integrated circuits, according to various embodiments of the invention. In these methods, a test array, such as Test Array 1210, is loaded with testing parameters configured to be used for testing more than one instance of IC 130. In some embodiments, testing parameters are loaded into Test Array 1210 by insertion of a non-volatile memory including a testing procedure. In other embodiments, testing parameters are loaded into Test Array 1210 by communicating a testing procedure (with associated testing parameters) into Test Array 1210. The testing parameters are optionally stored in an instance of Test Mode Registers 212 shared by a plurality of Test Modules 120.

In a Select IC Step 1910, an integrated circuit, e.g., IC 130, is selected for testing. This selection may include, for example, selection of a specific type of integrated circuit from a particular manufacturer.

In a Select Procedure Step 1920, a testing procedure is selected for testing the selected integrated circuit. The testing procedure is typically one of several alternative testing procedures configured for the selected integrated circuit or for different integrated circuits. Each of the alternative testing procedures is associated with a set of testing parameters. These parameters include data that, as discussed elsewhere herein, may be stored in Test Mode Registers 212. These parameters may also include delay data, such as that illustrated in FIG. 10, for use in scheduling delivery of commands to IC 130.

In an Insert IC Step 1930, one or more instances of the integrated circuit selected in Select IC Step 1910 are inserted into Test Array 1210. For example, in some embodiments, several instances of a memory chip are inserted into corresponding instances of Mount 1120 within a plurality of Test Mounting Boards 1110 within Test Array 1210.

In a Program Procedure Step 1940, the testing parameters characterizing the selected testing procedure are loaded into Test Array 1210. In some embodiments, the programming procedure includes inserting a non-volatile memory including the testing parameters into Memory 1220. In other embodiments, the programming procedure includes communicating the testing parameters to Memory 1220 after Memory 1220 has been inserted in Test Array 1210. Memory 1220 is configured to be shared by a plurality of instances of Test Module 120 within Test Array 1210. In other embodiments, the programming procedure includes communicating in parallel to each of several instances of Test Module 120 such that the testing parameters are loaded into a plurality of associated Test Mode Registers 212.

In an optional Test IC Step 1950, one of the integrated circuits inserted into Test Array 1210 is tested using automated testing equipment and the testing parameters loaded into Test Array 1210 in Program Procedure Step 1940.

Figure 20:
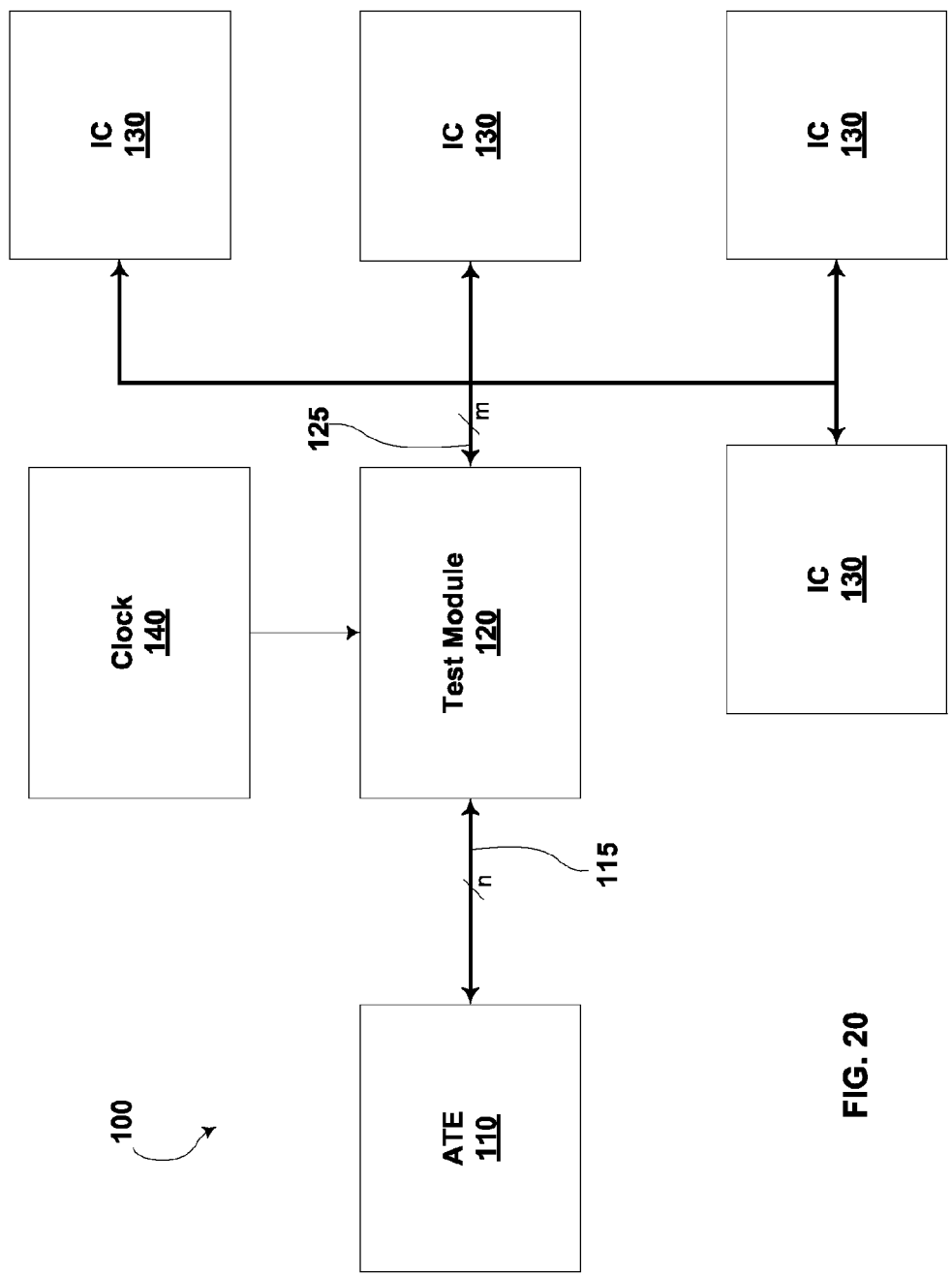
FIG. 20 illustrates embodiments of the invention wherein a test module is configured to test a plurality of integrated circuits.

FIG. 20 illustrates embodiments of the invention wherein Test Module 120 is configured to test a plurality of IC 130 in parallel. In these embodiments, the outputs of Clock Driver 220, Command Driver 222, Address Driver 224, and/or Data Interface 226 are provided to more than one instance of IC 130 in parallel. For example, the generated data outputs of Data Interface 226 (e.g., DQ[0:31]) may be divided among four separate IC 130, the first IC 130 receiving DQ[0-7], the second IC 130 receiving DQ[8-15], the third IC 130 receiving DQ[16-23], and the fourth IC receiving DQ[24-31]. The outputs of Clock Driver 220, Command Driver 222, and/or Address Driver 224 are also distributed to each of the four separate IC 130, each IC 130 typically receiving the same data from these components.

In some embodiments, each of the plurality of IC 130 illustrated in FIG. 20 is disposed within the same electronic device. For example, each IC 130 may be a separate memory chip within a SiP. Alternatively, each of the plurality of IC 130 illustrated in FIG. 20 may be disposed in separate electronic devices. For example, each of the plurality of IC 130 mounted on a different Test Mounting Board 1110 within Test Array 1210. In the embodiments of Test Module 120 illustrated in FIG. 20, ATE 110 can be used to test 2, 3, 4 or more IC 130 in the time it would take to test one IC 130 without the use of Test Module 120. Further, even when more than one IC 130 is tested in parallel, the testing can be at a clock frequency higher than that of ATE 110.

Figure 21:
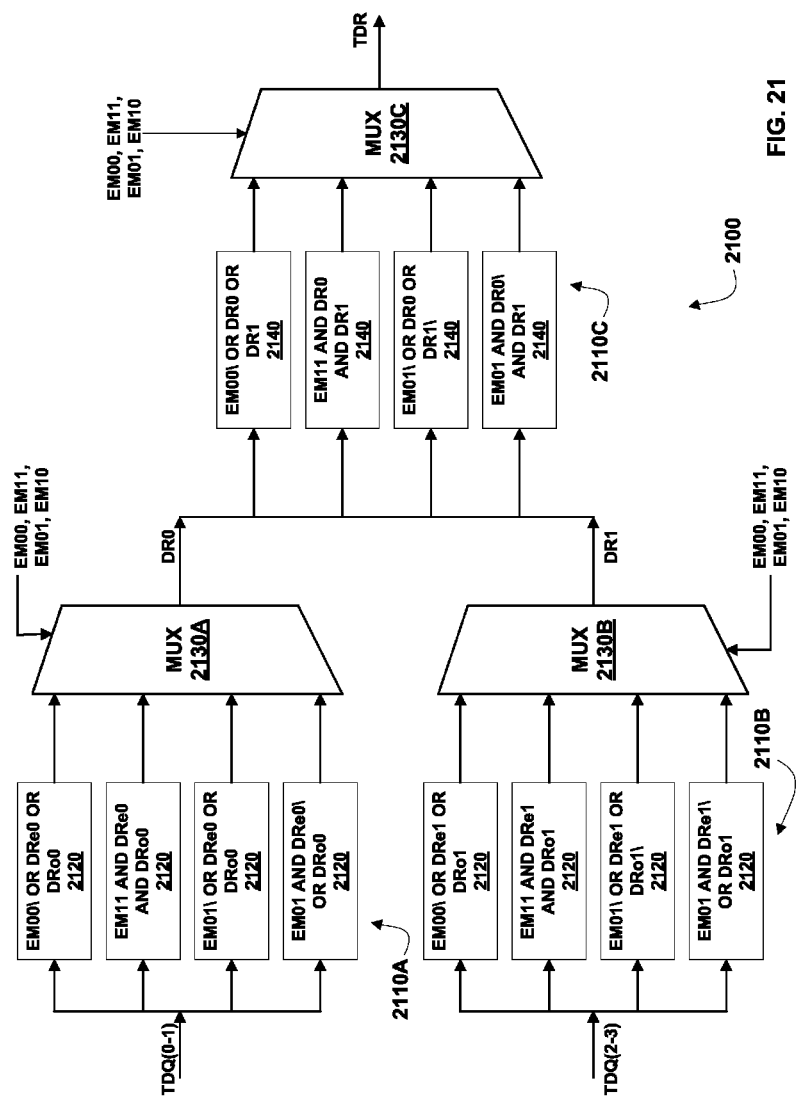
FIG. 21 illustrates logic used in serial compression following reading of data from an integrated circuit being tested.

FIG. 21 illustrates Logic, generally designated 2100 and used in serial compression following reading of data from IC 130. Serial compression is accomplished using expected data received from ATE 110 and optionally data scramble information received from Pattern Generation Logic 214. The expected data is optionally communicated to Test Module 120 from ATE 110 at the same time as test (TDQ) data. In some embodiments, the expected data is communicated through one or more additional data pins. For example, in some embodiments N-Channel Bus 115 includes two connections to pins of Test Module 120 configured for conveying expected data. In some embodiments, expected data is multiplexed through command pins. These embodiments may be applicable to testing of DDR memory or other devices that include an extra clock cycle following a command.

The compression performed by the Logic 2100 illustrated in FIG. 21 is serial in that bits used in the compression are received and processed in a serial manner, and also in that the compression takes place in two stages. A first stage in which Logic 2100 is applied is, in part, dependent on whether the first data received is from an even address or an odd address, and a second stage wherein the logic applied is, in part, dependent on results from neighboring bit pairs. The first stage includes Logic Gates 2120 divided into two sets, generally designated 2110A and 2110B, and configured to generate an output dependent on the expected data and the actual data received. The expected data is represented by enable match values EM00, EM11, EM01, and EM10. EM00 is to enable match "0,0" with an expected output of "0," EM11 is to enable match "1,1" with expected output "1," EM01 is to enable match "0,1" with an expected output "0," and EM10 is to enable match "1,0" with an expected output "1." Typically, the EM00, EM11, EM01, and EM10 inputs are used by applying these values, as received in expected data from ATE 110, to the inputs of NAND, AND, or OR gates within Logic Gates 2120. EM01 or EM10 is true if odd bit inversion is on, and EM00 or EM11 is true if odd bit inversion is off.

The data actually received is represented as DRe0, DRo0, DRe1, and DRo1 (DR=read data). DRe0 is the first actual bit value read from an even address and DRo0 is the first actual bit value read from an odd address. DRe1 is the second actual bit value read from an even address and DRo1 is the second actual bit value read from an odd address.

The Set of Logic Gates 2110A is configured to process two bits (DRe0 and DRo0), while the Set of Logic Gates 2110A is configured to process two bits (DRe1 and DRo1). In the illustrated example, Logic Gates 2120 are configured to process a total of four bits. In typical embodiments, the Sets of Logic Gates 2110A and 2110B are used serially on alternative clock cycles. Thus, two bits are processed in a first clock cycle and two bits are processed in a second clock cycle. Each Set of Logic Gates 2110A and 2110B is configured to compress two bits to one bit (DR0 and DR1, respectively) using the enable match values EM00, EM11, EM01, and EM10.

A MUX 2130A is configured to select one of the outputs of the Logic Gates 2120 within the Set of Logic Gates 2110A, and a MUX 2130B is configured to select one of the output of the Logic Gates 2120 within the Set of Logic Gates 2110B. These selections are dependent on which of the values of EM00, EM11, EM01, and EM10 are true. This selection produces a single bit result, e.g., DR0 or DR1, for each Set of Logic Gates 2110A and 2110B.

The second stage of the serial compression Logic 2100 illustrated in FIG. 21 includes a third Set of Logic Gates, generally designated 2110C. These Logic Gates 2140 are responsive to EM00, EM11, EM01, and EM10, as well as DR0 and DR1. This Set of Logic Gates 2110C is configured to compare the two results of the first stage of the serial compression logic (DR0 and DR1). Because these results are each themselves the result of a comparison between a pair of bits, the output of the second stage is dependent on the state of four input bits. The outputs of each Logic Gate 2140 are received by a MUX 2130C which selects one of these outputs, responsive to EM00, EM11, EM01, and EM10, to be the output TDR of the compression logic illustrated in FIG. 21.

The serial compression Logic 2100 illustrated in FIG. 21 results in a 4-to-1 compression ratio. The expected data values EM00, EM11, EM01, and EM10 each allow a compression of 2-to-1. Thus, by using these expected values in two logic stages the 2-to-1 compression can be achieved twice, resulting in the 4-to-1 compression ratio of the system. The two stage logic also allows the compression to be responsive to whether the least significant bit of the address from which data was read is odd or even and whether odd (or even) bits are inverted. While a 4-to-1 compression ratio could be achieved in a single logic stage, this would typically require more than four expected data values, not be responsive to whether the address was odd or even, or not be responsive to whether some bits were inverted. In alternative embodiments, more than four expected data values are used to achieve compression in a single logic stage, and/or a greater compression ratio.

FIGS. 22A and 22B illustrate the application of the compression Logic 2100 of FIG. 21. In FIG. 22A, a Table 2210A shows how the inputs TDQ(0-3) 2220 result in a TDQ Output 2260. The value of the output is responsive to the input values, whether or not the first data bit is from an even address (LSB=0 or not) 2230, whether the system is operating in a default mode 2240A without bit inversion (as opposed to a mode where even or odd bits are inverted 2240B), and the values of EM00 and EM11. The values shown in Table 2210A are representative of results in the default mode 2240A and the values shown in Table 2210B are representative of results in a mode where odd bits are inverted.

Figure 23:
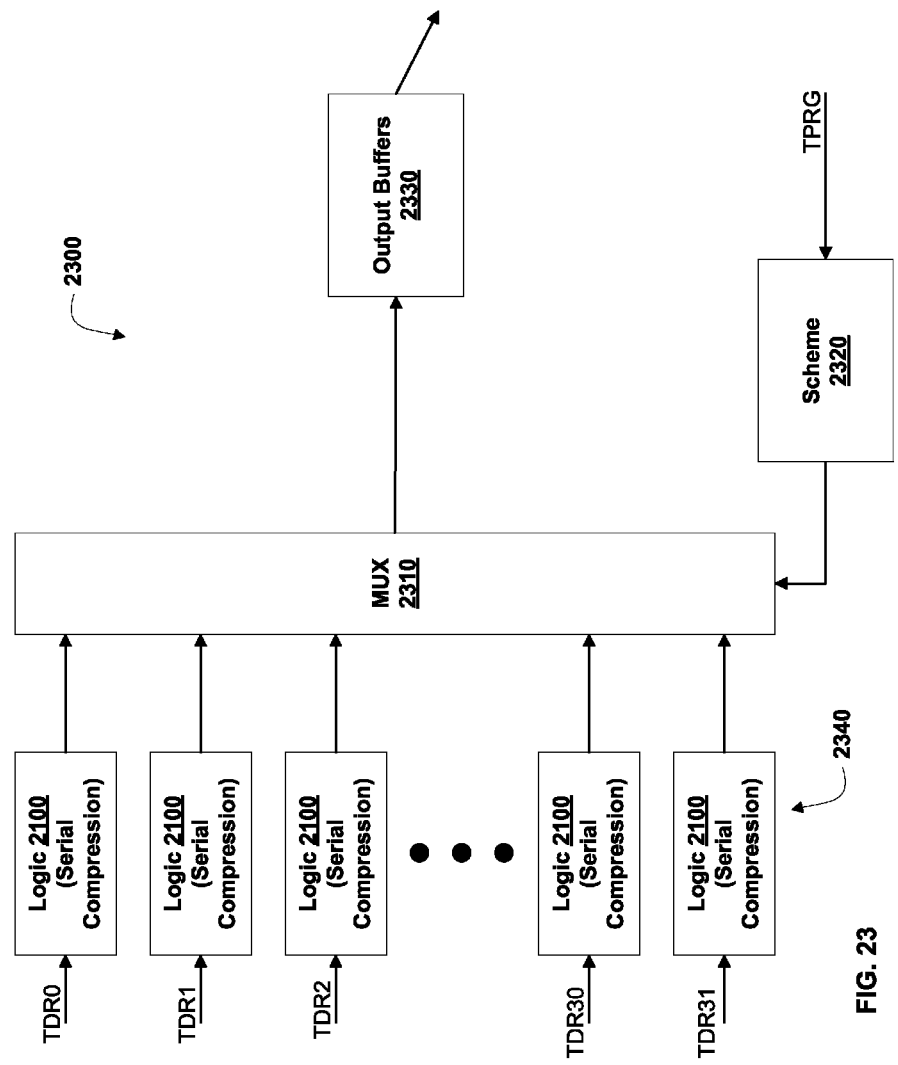
FIG. 23 illustrates logic used in parallel compression following the serial compression of FIG. 21.

FIG. 23 illustrates Logic, generally designated 2300 and used in parallel compression of data received from IC 130. Logic 2300 can be configured, for example, to achieve 32-to-8 compression of data. In a First Stage 2340 of Logic 2300, a series of Logic 2100 (FIG. 21) are used to compress data as described in relation to FIG. 21. As described, each of Logic 2100 receives and compresses bits in a serial manner. In First Stage 2340 this serial compression is performed by several (e.g., 8, 16, 32, 64 or more) Logic 2100 in parallel. The output of each Logic 2100 is received by a MUX 2310 configured to perform parallel compression based on a crossbar multiplexing scheme received from a Scheme 2320. Scheme 2320 is a buffer programmed to reflect a desired compression scheme.

The desired compression scheme is optionally communicated to Test Module 120 from ATE 110 at the same time as test (TDQ) data. In some embodiments, the expected data is communicated through one or more additional data pins. For example, in some embodiments, n-Channel Bus 115 includes two, three, four or more connections to pins of Test Module 120 configured for conveying the compression scheme. In some embodiments, the compression scheme is multiplexed through command pins. In some embodiments, the compression scheme is received from Pattern Generation Logic 214.

MUX 2310 can be a programmable gate array or other circuit known in the art to perform logic operations such as a crossbar multiplexing scheme. MUX 2310 can be hard-coded or programmed using software or firmware. In various embodiments, MUX 2310 may be programmed to perform 16-to-8, 32-to-8, 64-to-8, 128-to-8, 32-to-16, 64-to-16, 128-to-16, or similar compression schemes involving greater than 128 bits.

The output of MUX 2310 is received by Output Buffers 2330. Output Buffers 2330 are configured to receive the compressed data, which may include 8, 16, 32 or more bits. In some embodiments, Output Buffers 2330 includes Data Out Register 516.

Figure 24:
FIG. 24 illustrates a method of compressing data according to various embodiments of the invention.

FIG. 24 illustrates a method of compressing data according to various embodiments of the invention. In this method, data received from an IC 130 is compressed using the logic illustrated in FIGS. 21 and 23. In an optional Attach ATE Step 2410, Test Module 120 is attached to ATE 110. In an Attach IC Step 2420, IC 130 is attached to Test Module 120. In a Receive Step 2430, test data is received by Test Module 120 from an address within IC 130. In a Compress Step 2440, the received data is compressed to generate compressed data. This compression is optionally performed using the logic illustrated in FIGS. 21 and 23. This compression is also optionally responsive to expected data, the address with IC 130, and/or a mode in which certain bits are inverted. This inversion may involve every other bit (e.g., even bits or odd bits) or pair-wise inversion (e.g., two bits not inverted, two bits inverted, two bits not inverted, etc.). In a Provide Step 2450, the compressed data is provided to ATE 110.

Figure 25:
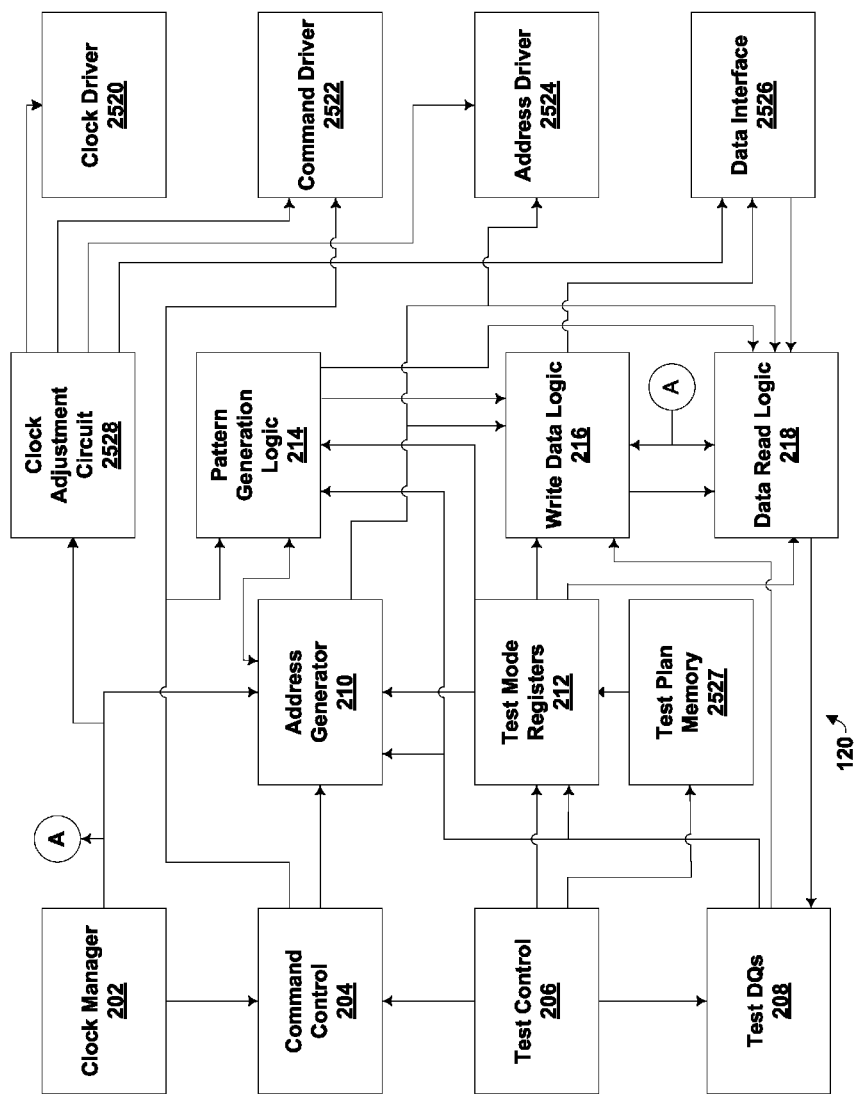
FIG. 25 is a block diagram of an alternative embodiment of a test module, including a clock adjustment circuit and a test plan memory, according to various embodiments of the invention.

FIG. 25 is a block diagram of an alternative embodiment of a test module, according to various embodiments of the invention. In these embodiments, Test Module 120 further includes Test Plan Memory 2527 configured to store test plans. A test plan may include a sequence of tests. For example, a test plan may be a series of data patterns to be sent to IC 130, an over voltage stress test, a synchronization test, a refresh related test (to test, for example, long RAS low failures, and refresh failure due to insufficient Write recovery time), a worst-case-timing access test (e.g., to screen cell-to-cell leakage, bitline-to-wordline resistive short, bitline-bitline short, wordline-wordline short, or single bit failures), and various combinations thereof. A test plan may change depending on the results received from IC 130 in response to the test signals sent. For example, a test plan may include conditional branches of which tests are to follow depending on whether the preceding test was successful or failed.

In some embodiments, some portions of a test plan, for example certain data patterns, may be stored in Test Control 206 while other portions of the test plan are stored in Test Plan Memory 2527. In other embodiments, some portions of test plans may additionally or alternatively be input via Test DQs 208.

In other embodiments, as described elsewhere herein, testing may involve multiple Test Mounting Boards 1110 as part of a Test Array 1210. When testing multiple modules, test plans stored in Test Plan Memory 2527 may be shared.

Test Plan Memory 2527, like Test Module Registers 212, may optionally be physically detachable (e.g., flash memory), from the test module such that test plans can easily be modified and/or updated depending on the integrated circuit or test array to be tested and the various sequences of tests and conditional branches of testing desired. Test Plan Memory 2527 can be predetermined or downloadable, for example from an external computer or other data source, at the start of a test session.

Various embodiments described herein render the test system, as a whole, capable of multiple layers of programming. For example, at one level, standard or more generic tests used for testing multiple classes of integrated circuit devices may be programmed and stored in Test Mode Registers 212. Other, device-specific tests may be programmed prior to each test session and downloaded into Test Plan Memory 2527. Tests frequently updated may be suited to being programmed and/or downloaded into Test Plan Memory 2527 and/or input via TDQ 208. Embodiments in which Test Plan Memory 2527 is detachable from Test Module 120 further increase the flexibility of such multiple layers of programming. In addition, different levels of programming may apply for command sets, addresses, and test vectors or data patterns. For example, certain test vectors or data patterns are likely to be standard or to recur between different test sessions (e.g., dependent on the type of IC 130 being tested). They may be stored in Test Mode Registers 212. Addresses, which may be specific to one or a few test sessions may be programmed and/or downloaded into Test Plan Memory 2527. Commands, which may optionally vary depending on the results of prior tests in a test sequence, may be input via TDQ 208.

In some embodiments, Test Module 120 further includes a Clock Adjustment Circuit 2528, as illustrated in FIG. 25. Clock Adjustment Circuit 2528 is configured to test aspects of an integrated circuit related to clock synchronization, for example set-up time and hold time. To test such aspects of the integrated circuit, Clock Adjustment Circuit 2528 is configured to adjust the edges of the reference clock signal relative to the edges of test signals. Test signals comprise commands, addresses, and/or data patterns. Clock Adjustment Circuit 2528 is configured to adjust the edges by adjusting the synchronization between the clock reference signal output from Clock Driver 2520 and one or more of the test signals sent from Command Driver 2522, Address Driver 2524, and/or Data Interface 2526 to IC 130. An adjustment may be made in response to one or more signals received from ATE 110 or a test plan.

Various aspects of the integrated circuit may be tested by adjusting different parameters. Different manners of adjustment may be used depending on the parameter of interest. For example, tRC, tRCD, tRP, tAC, tS, and tH may be adjusted by delaying the signal or signals of interest (e.g., by using delay elements such as a larger number of flip-flops). Some parameters, such as tRC, tRCD, tRP, may additionally or alternatively be tested by adjusting the clock reference signal output from Clock Driver 2520.

In some embodiments, an adjustment is made by Clock Adjustment Circuit 2528 to the signal going to Clock Driver 2520. As a result, an adjustment will apply to the output from Clock Driver 2520 and the test signals conveyed to IC 130 from Command Driver 2522, Address Driver 2524, and Data Interface 2526. In these embodiments, Test Module 120 is capable of testing the sensitivity of IC 130 to each clock adjustment.

In yet other embodiments, an adjustment is made to the clock signal controlling the output of individual data channels of the test signals conveyed to IC 130. Individual adjustments are made by Clock Adjustment Circuit 2528 to the signals going to, for example, one or more commands of Command Driver 2522, one or more address lines of Address Driver 2524, or one or more bits of Data Interface 2526. The adjusted generated test signals, including the adjusted data channels as well as the other unadjusted data channels, are conveyed to IC 130 via Command Driver 2522, Data Address Driver 2524, or Data Interface 2526, respectively. Data from IC 130 received in response to the adjusted generated test signals are read by Data Interface 2526 and, optionally, a comparison is made to expected test results. In these embodiments, Test Module 120 is capable of testing the sensitivity of individual bits or lines, or a combination or set thereof, of IC 130 to a variety of time critical and slew rate sensitive parameters, such as set-up and hold time.

Figure 26:
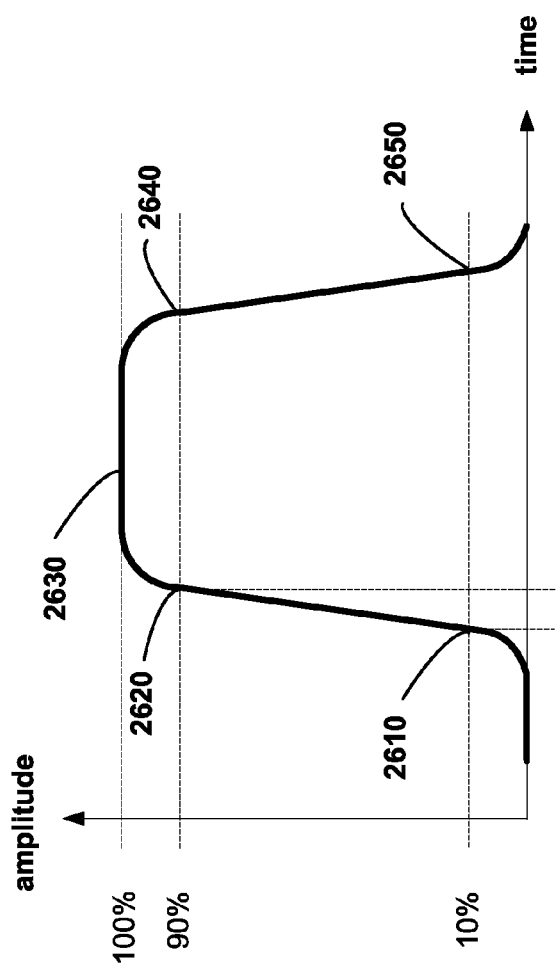
FIG. 26 illustrates a slew rate of a test signal.

FIG. 26 illustrates a slew rate of a test signal. Slew rate is the rate of change of a signal rising from low to high or falling from high to low. It is measured, on the rising edge, between 10% 2610 of the full signal amplitude 2630 and 90% 2620 of the full signal amplitude and, on the falling edge, between 90% 2640 of the full signal amplitude and 10% 2650 of the full signal amplitude. The maximum slew rate sets an upper boundary on the frequency at which signal transitions may be tested and, in turn, limits the maximum data rate. Reliable testing of parameters sensitive to clock synchronization, such as set-up time and hold time, requires a slew rate sufficiently fast to test the parameter at issue.

The length of the path traveled by a signal affects its slew rate. For example, the length of the cables between existing external testing equipment and the integrated circuits under test is sometimes on the order of meters. This may result in the input signals to the integrated circuit having slew rates too slow to reliably test some parameters. Test Module 120 is configured to be placed in close proximity to or on the same silicon die as IC 130. Therefore, in some embodiments, the length of the signal paths between Test Module 120 and IC 130 can be made insignificant with respect to its effect on slew rate. This allows Test Module 120 to more precisely shape signals conveyed to and received by IC 130. For example, in some embodiments, the slew rate of a transition from low to high between Test Module 120 and IC 130 is less than one nanosecond.

In some configurations, the faster slew rate (relative to the prior art) at which signals are conveyed from the output components of Test Module 120 to IC 130 may be used to test time sensitive parameters such as minimum set-up time and minimum hold time. The set-up time is the amount of time data signals must be stable prior to the active clock edge. The hold time is the amount of time data signals must be maintained past the active clock edge for the data to be stable upon sampling. To test these and other parameters, the test equipment is optionally configured for adjusting the relative timing between the clock reference signal and the generated test signals conveyed to IC 130.

FIGS. 27A-D illustrate the relationship between the clock reference signal conveyed from Clock Driver 2520 (including any adjustment made by Clock Adjustment Circuit 2528) to IC 130, the generated test signals, and the clock reference controlling the generated test signals. The clock reference controlling the generated test signals comprises the signals from Clock Adjustment Circuit 2528 to Command Driver 2522, Address Driver 2524, and/or Data Interface 2526, respectively. In some embodiments, IC 130 is clocked on the rising clock edge, for example in a single data rate memory device. Data is sampled when a command (CMD) is received at clock edge 2720. In embodiments clocked on the rising edge, the set-up time 2755 is the period following active clock edge 2710 from the time 2735 when the data signal reaches 90% of its full amplitude and thus becomes stable until the time 2745 when data is sampled. The hold time 2760 is the period from the time 2745 when data is sampled until the time 2750 when the amplitude of the data signal falls to 90% of its full amplitude and thus becomes unstable.

Figure 27:
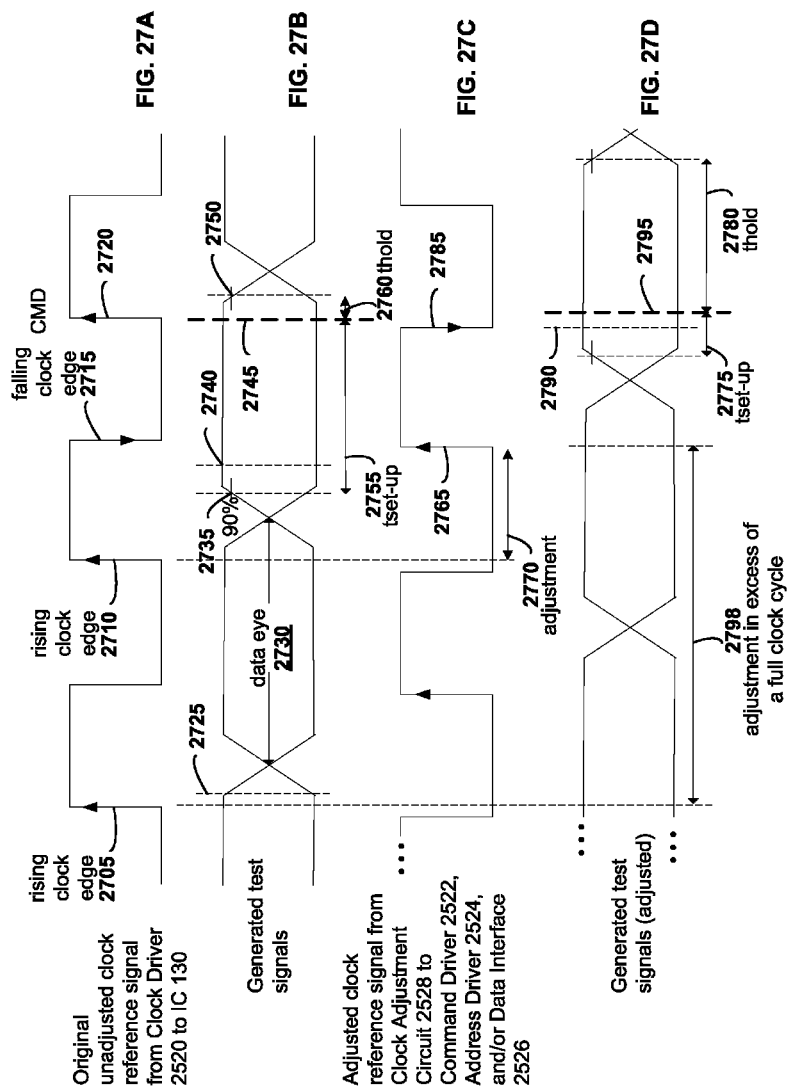
FIG. 27 illustrates set-up and hold times, according to various embodiments of the invention.

FIG. 27A illustrates the clock reference signal conveyed from Clock Driver 2520 to IC 130 (i.e., the original unadjusted clock reference signal). FIG. 27B illustrates the generated test signals. The original unadjusted clock reference signal is responsible for sampling the generated test signals. A short delay may occur between clock edge 2705 and the time 2725 when the generated test signals respond to clock edge 2705 and changes (e.g., from high to low or from low to high).

By adjusting the relative relationship between the original unadjusted clock reference signal and the clock reference signal controlling the generated data (illustrated in FIG. 27C), the minimum set-up time and hold time may be tested. The clock adjustment 2770 is the difference between the active clock edge 2710 of the clock reference signal conveyed to IC 130 from Clock Driver 2520 and the active edge 2765 of the clock reference signal controlling one or more data channels to Command Driver 2522, Address Driver 2524, and/or Data Interface 2526.

FIG. 27D illustrates the one or more data channels of the generated data adjusted by the clock reference signal in FIG. 27C. As illustrated in FIG. 27D, the set-up time 2775 of the one or more adjusted data channels decreases compared to the set-up time 2755 of the generated data prior to the adjustment. Likewise, the hold time 2780 increases compared to hold time 2760. By varying the adjustment 2770, the sensitivity of IC 130 to set-up time as well as hold time may be tested. It should be noted that while the timing of the generated test signals is dependent on the adjusted clock reference signal (and thus adjusted in FIG. 27D relative to FIG. 27B), the sampling of the generated test signals is still responsive to the original unadjusted clock reference signal.

In some embodiments, IC 130 is clocked on a falling clock edge. When the active clock edge 2715 is falling, the set-up time becomes more critical, because the time for the signal to become stable is decreased. This decrease is illustrated in FIGS. 27B and 27D. In FIG. 27B, on a falling clock edge 2715, the set-up time is the time between time 2745 and time 2750, which is shorter than the set-up time 2755 that results when IC 130 is clocked on the rising clock edge 2710. In FIG. 27D, on a falling clock edge 2785, the set-up time is the time between time 2790 and time 2795 (when the data is sampled), which again is shorter than the set-up time 2755 that resulted when IC 130 is clocked on the rising edge 2710.

In some embodiments, Clock Adjustment Circuit 2528 may comprise a delay locked loop, which allows for generating both positive and negative adjustments. For example, instead of applying a positive 105% adjustment, a negative 95% adjustment may be made. Whereas a positive adjustment 2770 results in a relative decrease in the set-up time and increase in the hold time, by analogy, a negative adjustment 2770 would result in a relative increase in the set-up time and a relative decrease in the hold time.

In some embodiments, Clock Adjustment Circuit 2528 is capable of generating incremental adjustments through the full range of a clock cycle (e.g., 5% of the clock cycle, 10% of the clock cycle, etc.) and/or the next clock cycle (i.e., in excess of a full clock cycle). An example of an adjustment in excess of a full clock cycle 2798 is illustrated in FIGS. 27A and 27C between rising clock edge 2705 and the corresponding rising clock edge at 2765.

One full clock cycle corresponds to the width of a data eye 2730. The data eye 2730 is the center of an eye diagram depicting digital data transitions from low to high over a period of three clock cycles.

Figure 28:
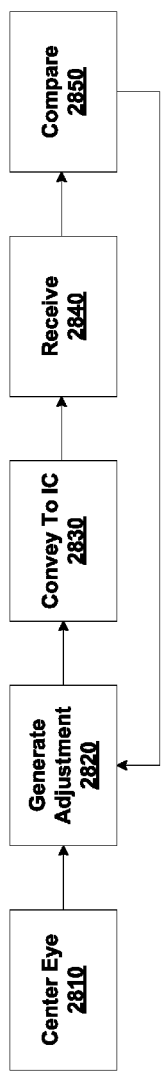
FIG. 28 illustrates methods of testing the set-up time or hold time of an integrated circuit, according to various embodiments of the invention.

FIG. 28 illustrates methods for determining whether IC 130 passes a set-up or hold time test, according to various embodiments of the invention. In a Center Eye Step 2810, the eye 2730 of the generated data is first centered around a data sampling time using one of several techniques existing in the prior art. In a Generate Adjustment Step 2820, an adjustment is generated via Clock Adjustment Circuit 2528. The adjustment is applied to Clock Driver 2520 or to the individual outputs of Command Driver 2522, Address Driver 2524, and/or Data Interface 2526. In a Convey To IC Step 2830, the adjusted generated data is conveyed to IC 130 via Data Address Driver 2524, Command Driver 2522, and/or Data Interface 2526. In a Receive Step 2840, data from IC 130 received in response to the adjusted generated test signals are read by Data Interface 2526. In a Compare Step 2850, a comparison is optionally made to expected test results (e.g., by comparison to specified values or specifications). Optionally, the test sequence may be repeated from Generate Adjustment Step 2820 by making additional adjustments. In this manner, Test Module 120 is capable of determining whether IC 130 passed or failed one or more set-up time or hold time tests.

Test Module 120 when configured to operate with Clock Adjustment Circuit 2528 in one of the described configurations and embodiments is further capable of operating at two different clock frequencies, as described elsewhere herein.

Figure 29:
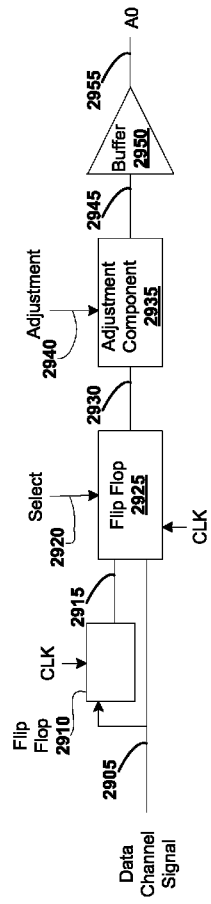
FIG. 29 illustrates a circuit diagram for testing the set-up time or hold time of an integrated circuit, according to various embodiments of the invention.

FIG. 29 illustrates a circuit diagram for testing set-up or hold time. As described elsewhere herein, a clock adjustment in excess of one clock cycle may be used in some test scenarios for testing time and slew rate sensitive parameters. An adjustment in excess of one clock cycle, for example 1.2 clock cycles, comprises an integer number of full clock cycles (e.g. 1) plus a fraction of a clock cycle (e.g., 0.2). Flip Flop 2910 is configured to delay a data channel signal 2905 by an integer number of clock cycles. In some embodiments, Flip Flop 2910 may comprise multiple flip flops. Flip Flop 2925 is configured to select either the unadjusted data channel signal 2905 or the adjusted data channel signal 2915 for clocking to an Adjustment Component 2935. Flip Flop 2925 is configured to make the selection in response to a select input signal 2920 received from ATE 110, a test plan or test pattern (e.g., stored in Test Mode Registers 212 and/or Test Plan Memory 2527), and/or Test DQs 208. Adjustment Component 2935 is configured to further adjust data channel signal 2930 by a fraction of a clock signal (e.g., 0.2 clock cycles) in response to an adjustment signal 2940 conveyed from Clock Adjustment Circuit 2528 to Command Driver 2522, Address Driver 2524, or Data Interface 2526. For example, if the data channel signal is address line A0, adjustment signal 2940 is the individual adjustment to that particular address line conveyed from Clock Adjustment Circuit 2528 to Address Driver 2524. In this manner, the data channel signal 2945 output from Adjustment Component 2935 has been adjusted for the integer as well as the fraction of a clock cycle. Buffer 2950 is configured to store the adjusted data channel signal 2945 prior to conveying adjusted data channel signal 2955 (e.g., address A0) to IC 130. In alternative embodiments, Flip Flop 2910 may be omitted and Adjustment Component 2935 may perform the full adjustment desired, including adjustments by a full clock cycle or more, in response to the adjustment signal 2940 received. Adjustments of a fraction of a clock cycle may be accomplished using an analog and/or digital delay line. In various embodiments, adjustments as small as 0.05, 0.1, 0.2 and/or 0.5 clock cycles are possible.

Figure 30:
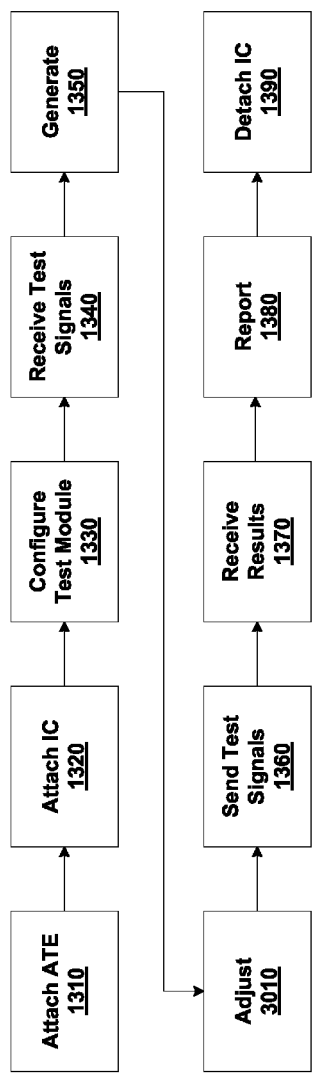
FIG. 30 illustrates methods of testing an integrated circuit using a test module including a clock adjustment, according to various embodiments of the invention.

FIG. 30 illustrates alternative methods of testing IC 130 using Test Module 120, including an Adjust Step 3010, according to various embodiments of the invention. Attach ATE Step 1310, Attach IC Step 1320, Configure Test Module Step 1330, Receive Test Signals Step 1340, Generate Step 1350, Send Test Signals Step 1360, Receive Results Step 1370, Report Step 1380, and Detach IC Step 1390 are performed as described elsewhere herein.

In addition, Configure Test Module Step 1330 may include specifying test plans stored in Test Plan Memory 2527 and/or in Test Mode Registers 212, and/or test signals input from ATE 110 to Test DQs 208. In Receive Test Signals Step 1340, the signals received by Test Module 120 may, optionally, be received at a first slew rate. Generate Step 1350 typically includes the use of Test Plan Memory 2527 and/or the use of Address Generator 210 to generate test addresses, and/or the use of Test Plan Memory 2527 and/or Pattern Generation Logic 214 and Write Data Logic 216 to generate test signals.

In an optional Adjust Step 3010, timing of one or more data channels of the test signals generated in Generate Step 1350 is adjusted relative to the clock reference signal. Adjust Step 3010 includes the use of Clock Adjustment Circuit 2528 to generate the adjustment. The generation and use of adjustments are described elsewhere herein. The adjustment of Adjust Step 3010 may be configured to test set-up and/or hold times.

In a Send Test Signals Step 1360, the test signals sent from Test Module 120 to IC 130 are additionally adjusted in Adjust Step 3010. Furthermore, the test signals generated in Generate Step 1310 are optionally sent at a second, faster, slew rate.

In a Report Step 1380, in some embodiments, the expected result may be stored in Test Plan Memory 2527. In some embodiments, the value indicating "Pass" or "Fail" may be output in response to multiple comparisons, e.g., as an indication of whether a set of tests included in a test plan, as a whole, passed or failed.

Several embodiments are specifically illustrated and/or described herein. However, it will be appreciated that modifications and variations are covered by the above teachings and within the scope of the appended claims without departing from the spirit and intended scope thereof. For example, in some embodiments, all or part of Test Module 120 is incorporated within ATE 110 as a detachable module. In these embodiments, Test Module 120 is optionally replaceable in order to upgrade ATE 110. Test Module 120 is optionally included in a read head of ATE 110. In some embodiments, Testing Interface 120 is optionally configured to perform repairs to IC 130. For example, Testing Interface 120 may include circuits configured to burn fuses within IC 130 or configured to convey repair signals from ATE 110 to IC 130. While the inversion of odd bits is discussed herein, one of ordinary skill in the art would understand that the inversion of even bits may be accomplished in an equivalent approach.

In some embodiments of the invention, Test Module 120 is configured for selecting which component to test, from among several components within an electronic device. For example, Test Module 120 may be included in a SiP and be configured to select one of a plurality of different memories within the SiP for testing. In these embodiments, a first instance of Test Module 120 may be included in the SiP and a second instance of Test Module 120 may be disposed between ATE 110 and the SiP. The first instance of Test Module 120 is used for selecting which circuits to be tested in a test mode and the second instance of Test Module 120 is used to test the SiP at a higher clock frequency than that of ATE 110.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated.

What is claimed is:

1. An apparatus, comprising:
   a first component to communicate at a first frequency, the first components comprising a receiving component to receive a test signal at the first frequency and to output information derived from the test signal;
   a data generating component coupled to receive the information from the first component and to generate test data responsive to the information; and
   a second component to transmit test data based on the information to at a second frequency different than the first frequency.

2. The apparatus of claim 1, wherein the apparatus is a test module.

3. The apparatus of claim 2, wherein the first component is to communicate with a test equipment and the second component is to transmit the test data to a device external to the apparatus.

4. The apparatus of claim 1, wherein the data generating component is programmable.

5. The apparatus of claim 1, wherein the first component comprises at least one of a clock manager, a command unit, a test control unit or a test data interface.

6. The apparatus of claim 1, wherein the data generating component to generate at least one of test codes, vectors or patterns as the test data.

7. The apparatus of claim 3, wherein the data generating component to generate a sequence of test and a series of data patterns associated with the test data to be sent to the device.

8. The apparatus of claim 1, wherein the data generating component comprises a clock manager to receive a test clock signal at the first frequency and a PLL clock, the clock manager to generate another clock signal at the second frequency.

9. The apparatus of claim 1, wherein the second component comprises at least one of a clock driver, a command driver, an address driver or a data interface.

10. A method, comprising:
    receiving a first signal having a first frequency from a testing equipment;
    generating a test signal based on the first signal; and
    sending the test signal to an apparatus at a second frequency different than the first frequency.

11. The method of claim 10, wherein the first signal is configured to select a test plan from a test plan memory component.

12. The method of claim 11, wherein the apparatus is an integrated circuit and wherein the method further comprises changing the test plan based on results received from the integrated circuit in response to the test signal.

13. The method of claim 10, wherein generating the test signal is performed by a test module.

14. The method of claim 13, wherein the apparatus is a device different than the test module.

15. The method of claim 10, wherein the first signal is received by one of a clock manager, a command unit, a test control unit or a test data interface.

16. The method of claim 10, further comprising storing at least one of test codes, vectors or patterns as the test signal.

17. The method of claim 10, further comprising storing a series of data patterns associated with the test signal to be send to the apparatus.

18. The method of claim 10, wherein receiving the first signal having the first frequency is performed by a clock manager and wherein the method further comprises generating, by the clock manager, another clock signal at the second frequency.

19. The method of claim 10, wherein sending the test signal comprising sending the test signal by one of a clock driver, a command driver, an address driver or a data interface.

* * * * *